United States Patent
Keating

(10) Patent No.: US 7,508,274 B2
(45) Date of Patent: Mar. 24, 2009

(54) PLL WITH PHASE CLIPPING AND RESYNCHRONIZATION

(75) Inventor: Pierce Keating, Issaquah, WA (US)

(73) Assignee: RadioFrame Networks, Inc., Redmond, WA (US)

( * ) Notice: Subject to any disclaimer, the term of this patent is extended or adjusted under 35 U.S.C. 154(b) by 414 days.

(21) Appl. No.: 11/441,266

(22) Filed: May 25, 2006

(65) Prior Publication Data

US 2006/0267695 A1 Nov. 30, 2006

Related U.S. Application Data

(60) Provisional application No. 60/684,824, filed on May 25, 2005.

(51) Int. Cl.
*H03L 7/085* (2006.01)
(52) U.S. Cl. .................... 331/16; 331/17; 331/176; 331/1 A; 327/156
(58) Field of Classification Search ................ 331/16, 331/17, 25, 1 A, 176; 327/156, 157, 159; 375/373–376
See application file for complete search history.

(56) References Cited

U.S. PATENT DOCUMENTS

| | | | | |
|---|---|---|---|---|
| 5,592,113 A | * | 1/1997 | Quiet et al. .................. | 327/158 |
| 5,872,819 A | * | 2/1999 | Carsello et al. .............. | 375/355 |
| 6,023,198 A | * | 2/2000 | McKinney et al. ............ | 331/17 |
| 6,046,645 A | | 4/2000 | Cucchi et al. | |
| 6,081,571 A | | 6/2000 | Jansson et al. | |
| 6,359,945 B1 | * | 3/2002 | Doblar ........................ | 375/357 |
| 2003/0137997 A1 | * | 7/2003 | Keating ...................... | 370/519 |
| 2005/0184773 A1 | * | 8/2005 | Boyko et al. ................. | 327/156 |

FOREIGN PATENT DOCUMENTS

JP 401291524 11/1989

* cited by examiner

*Primary Examiner*—Robert Pascal
*Assistant Examiner*—Ryan J. Johnson
(74) *Attorney, Agent, or Firm*—Van Pelt, Yi & James LLP

(57) ABSTRACT

A phase locked loop with phase clipping and/or resynchronization is disclosed. A reference signal is compared to a feedback signal derived at least in part from an output signal of an oscillator to determine a phase error. A magnitude of at least one of the phase error and a change in the phase error, if required, is clipped to provide at least one of a clipped phase error that has a clipped magnitude that does not exceed a prescribed maximum phase error and a clipped change in phase error that has a clipped magnitude that does not exceed a prescribed maximum change in phase error. If a resynchronization triggering event is detected, the oscillator is resynchronized with the reference signal.

25 Claims, 20 Drawing Sheets

PLL WITH PHASE CLIPPING AND RESYNCHRONIZATION

CROSS REFERENCE TO OTHER APPLICATIONS

This application claims priority to U.S. Provisional Patent Application No. 60/684,824 entitled PLL with Phase Clipping and Resynchronization, filed May 25, 2005, which is incorporated herein by reference for all purposes.

BACKGROUND OF THE INVENTION

The phase locked loop (PLL) and frequency locked loop (FLL) are well-known closed loop feedback circuits commonly used to maintain synchronization between an oscillator or other clock or frequency signal generator, such as a digital frequency synthesizer, and a reference signal. FIG. 1 illustrates an embodiment of a typical prior art PLL. In the example shown, in PLL 100 the output of oscillator 102 is provided to a divider, the output of which is provided to a phase detector 106. The phase detector 106 receives a reference (e.g., timing) signal on line 108, and generates and provides as output on line 110 an error signal that reflects the difference in phase, if any, between the feedback signal provided by divider 104 and the reference signal received on line 108. The error signal on line 110 is filtered using a low pass filter 112 (sometimes referred to as a "loop filter") to provide to oscillator 102 via line 114 a control signal to keep the oscillator in synch with the reference signal, e.g., by causing it to speed up or slow down—for example by increasing or decreasing the control voltage supplied to a voltage control oscillator—as required to bring it back into phase synchronization with the reference. A FLL is similar to a PLL except that the time derivative of the phase information is used.

A PPL or FLL achieve acceptable results and performance in environments in which the communication path between the source of the reference signal and the PLL or FLL is stable and/or predictable. However, if the transmission path is characterized by excessive jitter/noise and/or is susceptible to long term changes, such as long term changes in average transmission delay, such conditions can affect the results obtained by using a typical prior art PLL or FLL. One possible response to jitter or noise in the transmission path would be to narrow the bandwidth of the loop filter, to filter out the jitter or other noise. However, that approach has the potentially undesirable effect of significantly slowing response to conditions affecting oscillator performance, such as environmental changes (e.g., increased or decreased temperature), crystal or other oscillator component aging, and other factors that can affect the short term accuracy of an oscillator. A FLL typically would respond better than a PLL to long term changes in transmission delay of the reference/timing signal; however a typical prior art FLL suffers from the same shortcoming as a typical prior art PLL with respect to the effect of jitter or other short term noise in the transmission path.

Therefore, there is a need for an effective way to maintain synchronization between a local oscillator and a reference signal transmitted via a path characterized by excessive jitter or other noise. Similarly, there is a need for an effective way to maintain synchronization between a local oscillator and a reference signal when changes in the long term average transmission delay of a path via which the reference signal is provided.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A PLL with phase clipping is disclosed. In some embodiments, it is determined whether a detected phase error exceeds a prescribed maximum. If so, the error is clipped (i.e., set) to be equal to the prescribed maximum, and the clipped error is provided as input to the loop filter; otherwise the actual error is used. A PLL with resynchronization is disclosed. In some embodiments, it is determined whether a long term change in transmission delay along a path by which a reference signal is provided has occurred. If so, the PLL is resynchronized, substantially instantaneously, with the phase median of the reference signal.

Figure 1:
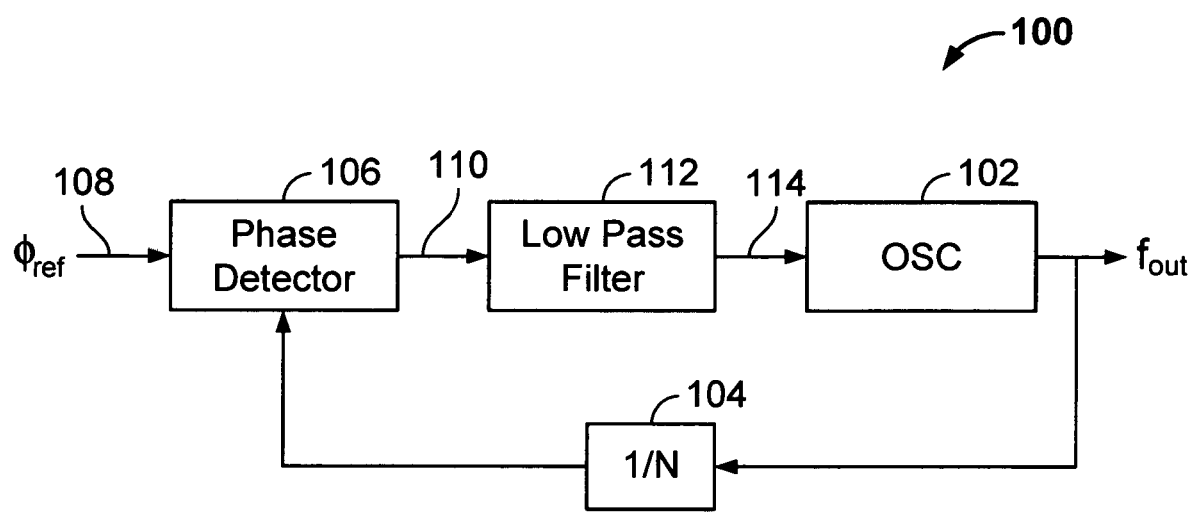
FIG. 1 illustrates an embodiment of a typical prior art PLL.
Figure 2A:
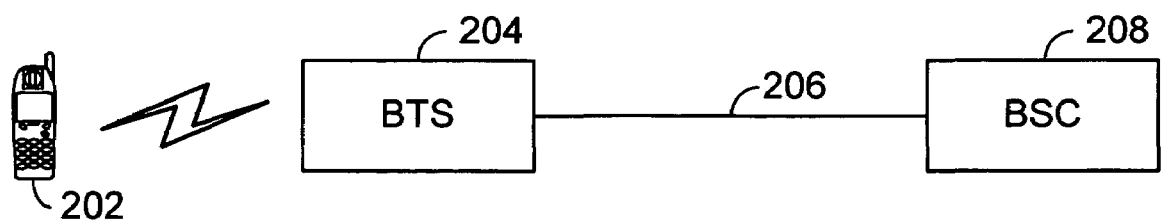
FIG. 2A shows base station subsystem elements of a typical prior art GSM network.
Figure 2B:
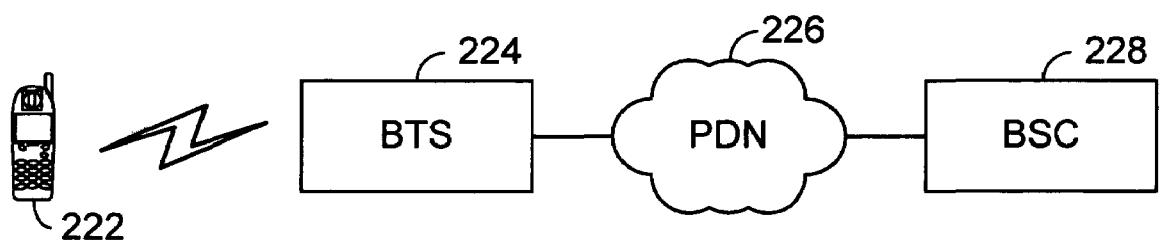
FIG. 2B shows a BTS connected to a BSC via a packet data network.

In some embodiments, a PLL with phase clipping, resynchronization, or both is used to maintain synchronization between a local oscillator or other frequency source and a reference signal provided from a remote source via a communication path characterized by excessive jitter (or other noise) and/or potentially subject to long term changes in transmission delay. One example of such a communication path is a packet data network, such as the Internet. In certain cases, timing data is required to be transmitted via such a network, e.g., to ensure that an oscillator at a remote location is maintained at a prescribed frequency within a prescribed tolerance. One example is a mobile telecommunications context, such as a GSM network. FIG. 2A shows base station subsystem elements of a typical prior art GSM network. In the example shown, a mobile station 202 communicates via an air interface with a base transceiver station (BTS) 204. BTS 204 communicates via a dedicated link 206 with a base station controller (BSC) 208, which in turn provides connectivity to the core network via the network switching subsystem (e.g., the mobile switching center), not shown. Under standards applicable to GSM networks, e.g., a BTS requires a frequency source that is required to be frequency accurate within 100 parts per billion (ppb). In a typical prior art base station subsystem, such as the one shown in FIG. 2A, the required synchronization typically is achieved by provide a reference signal from the BSC to the BTS via the line 206, to be used at the BTS, e.g., as a reference input to a PLL such as the one shown in FIG. 1. Because the line 206 typically is a dedicated trunk line, such as a T-1 or E-1 line, the transmission delay typically is stable over the short term (no or low jitter) and the long term. However, technologies have been developed to enable data to be communicated between a BTS and the BSC via a packet data network, such as the Internet or another public or private IP network. FIG. 2B shows a BTS connected to a BSC via a packet data network. A mobile station 222 communicates via an air interface with a BTS 224. The BTS 224 is connected to a BSC 228 via a packet data network 226. In the environment shown in FIG. 2B, a reference signal may be provided by the BSC 228 to the BTS 224 via packet data network 226, e.g., in the form of a timing packet sent periodically from BSC 228 to BTS 224. Alternatively timing packets may be provided by the BSC 228 in response to one or more requests by the BTS 224 via the packet data network. Further, the timing packet sent by the BSC 228 may include phase information in the payload of the packet, such as the current time at the BSC 228 when the timing packet is transmitted. Including phase information in the payload of the packet is one method by which the intervals between the transmissions of timing packets can vary and be less periodic. Alternatively, phase information can be implied in the time intervals in which the timing packets are transmit. That is, timing packets may be transmit with a periodicity, such as once a second, through which phase is conveyed merely by noting the time of reception of the timing packets at the BTS 224. However, the relatively high jitter associated with packet data network 226, particularly in an embodiment in which packet data network 226 includes the Internet, as well as the potential for changes in the long term average transmission delay for timing packets sent from the BSC 228 to BTS 224 (e.g., due to changes in the transmission path resulting from changes in packet data network topology and/or traffic/use patterns) present a challenge in maintaining frequency synchronization within the range required by applicable standards, while minimizing frequency errors induced by packet data network 226 jitter and delay variations.

Figure 3:
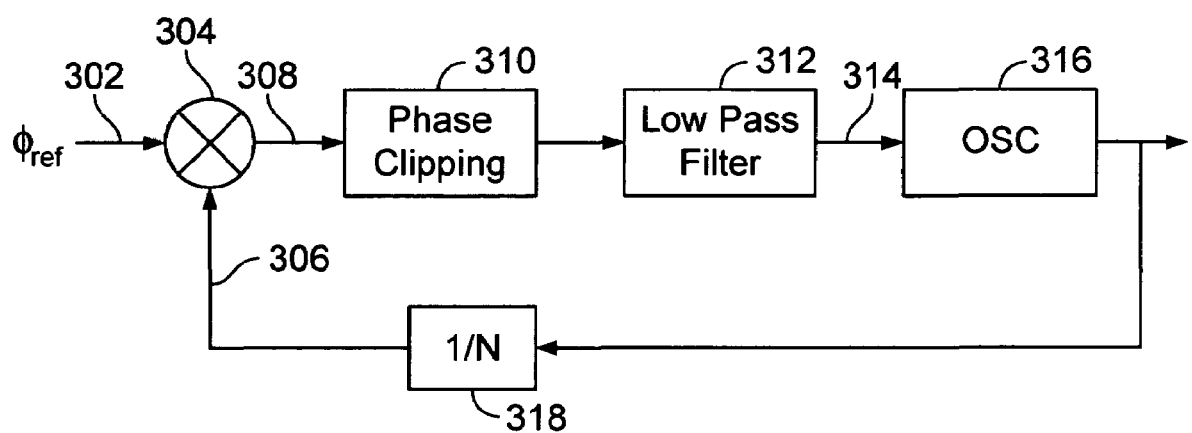
FIG. 3 is a block diagram illustrating an embodiment of a PLL with phase clipping.

FIG. 3 is a block diagram illustrating an embodiment of a PLL with phase clipping. In the example shown, a phase error output provided by a phase detector is clipped (capped) at a maximum value, preventing the PLL from attempting to track (fully) short term high magnitude errors likely attributable to network jitter. A reference signal 302, such as a timing packet, is received via a packet data network and provided to a phase detector 304. The phase detector 304 compares the reference with a divided down feedback signal 306 and provides a phase error signal 308 to a phase clipping logic 310. In some embodiments the divided down feedback signal 306 is the value of a counter, which rolls over according to a modulus N. In some embodiments, the counter value is read as a phase error value at substantially the same time that a timing packet is received. In other embodiments, the counter value is compared with phase information contained in the payload of the timing packet and a difference is used as a phase error. The phase clipping logic 310 compares the error to a prescribed maximum error and clips (sets) the error to a level equal to the prescribed maximum if the error provided to the clipping logic exceeds the maximum. The clipped error, or the original error if less than or equal to the maximum, is provided by the phase clipping logic 310 to a low pass filter 312, which uses the received error to generate and provide to oscillator 316 a control signal 314 calculated to drive the oscillator 316 into synchronization with the reference. In some embodiments, the oscillator 316 comprises a voltage controlled oscillator and the control signal 314 indicates a control voltage to be applied. The output of oscillator 316 is fed back via a loop divider 318 to provide divided down feedback signal 306.

Figure 4:
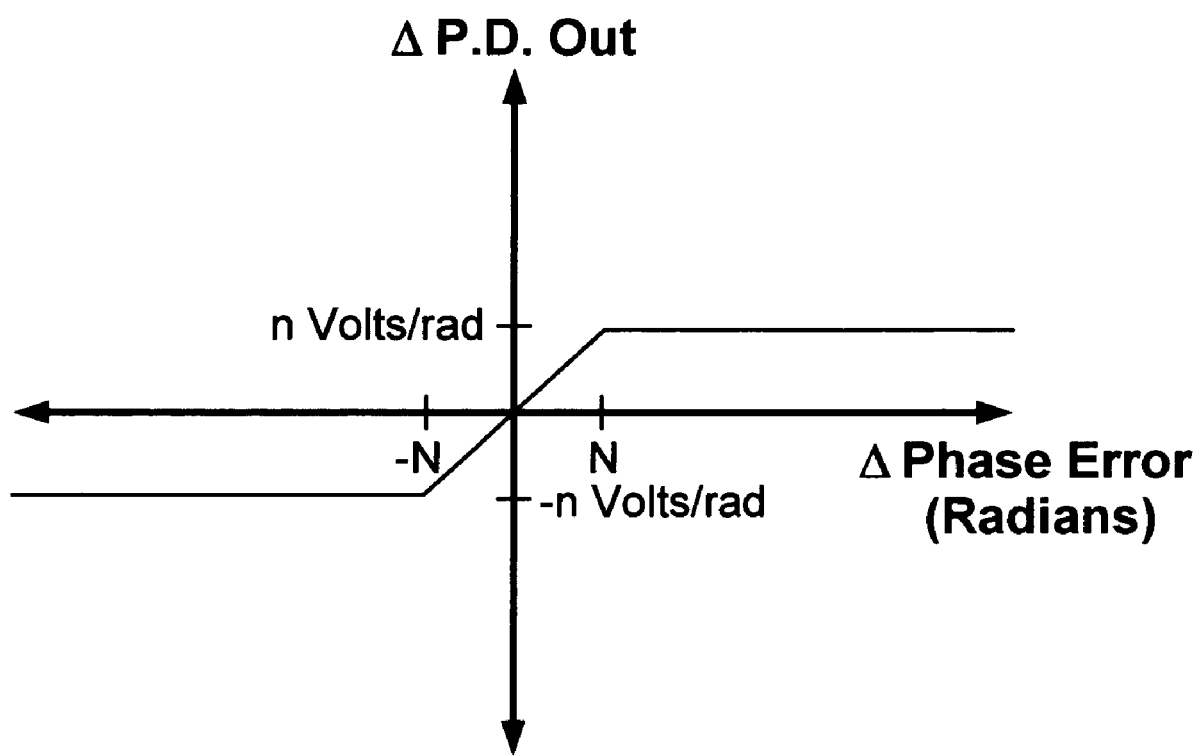
FIG. 4 depicts the response of a clipped phase detector for a type I PLL as a function of detected phase error change.
Figure 5:
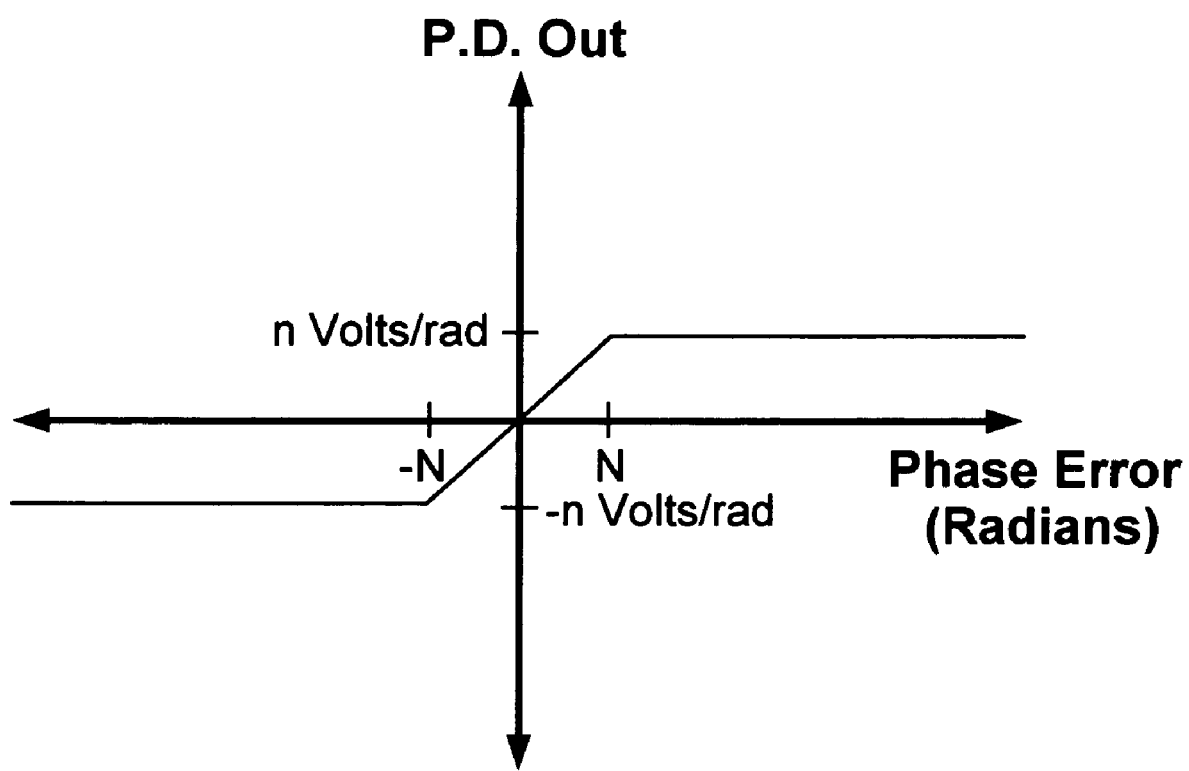
FIG. 5 depicts the response of a clipped phase detector for a PLL with more than one pole at the origin of the s-plane, such as a type II or type III loop, as a function of detected phase error.

A clipped phase PLL can be implemented as a type I loop, with a single pole at the origin of the complex s-plane or as a type II loop with two poles substantially at the origin. FIG. 4 depicts the response of a clipped phase detector for a type I PLL as a function of detected phase error change. In FIG. 4, the clipped phase detector output magnitude is gauged along the vertical axis labeled " ΔP.D. Output". The vertical axis refers to the relative plus or minus change in the phase detector output from a first sample to a following sample. The horizontal axis refers to the relative plus or minus change in the detected phase error from a first sample to a following sample. In FIG. 4, it can be seen that when a phase error change is less than or equal to the absolute value of N, then the phase detector output will change in a linear fashion. The function depicted in FIG. 4 also shows that when a phase error change is greater than the absolute value of N, the phase detector output will change with a maximum and constant value, having a polarity consistent with the polarity of the phase error change. FIG. 5 depicts the response of a clipped phase detector for a PLL with more than one pole at the origin of the s-plane, such as a type II or type III loop, as a function of detected phase error. It can be seen that FIG. 5 is identical to FIG. 4, except that the axes do not represent changes of values but rather absolute values. In FIG. 5, it can be seen that when a detected phase error is less than or equal to the absolute value of N, then the phase detector output will change linearly in proportion to the detected phase error. The function depicted in FIG. 5 also shows that when a phase error is greater than the absolute value of N, the phase detector output maintains a maximum and constant value, having a polarity consistent with the polarity of the detected phase error.

Figure 6:
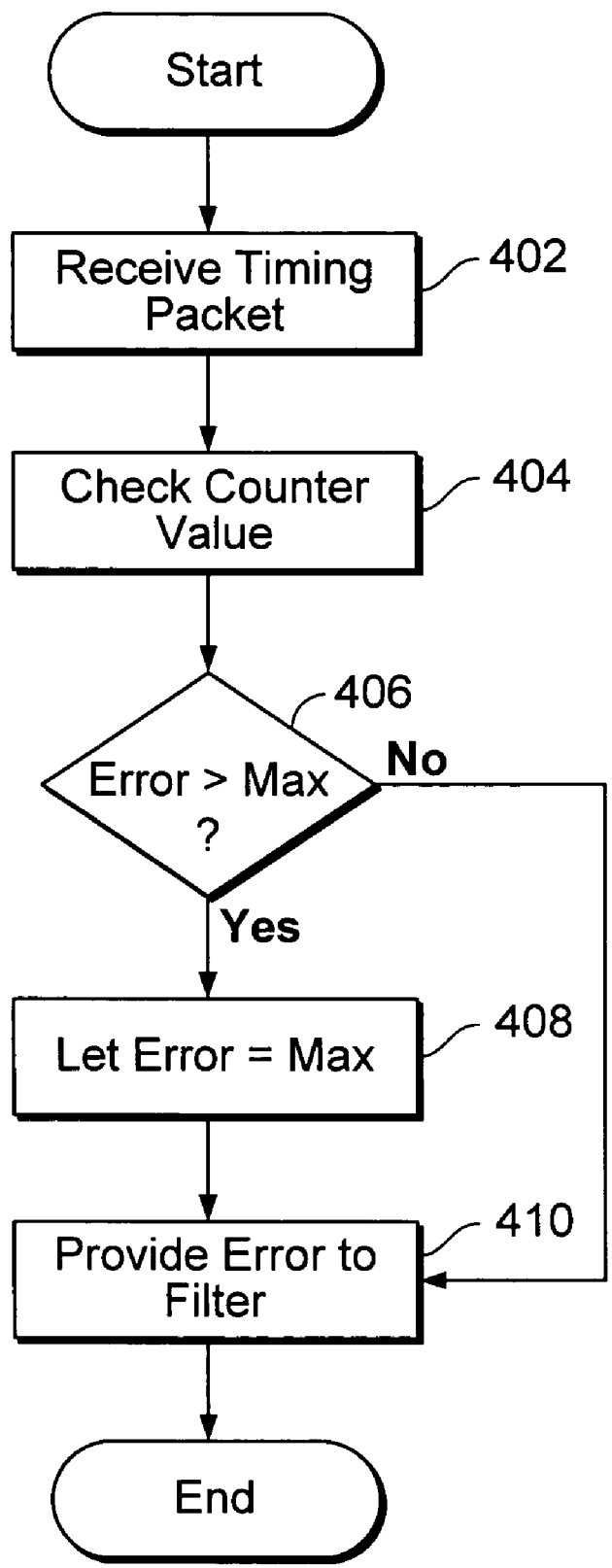
FIG. 6 is a flow chart illustrating an embodiment of a process for phase clipping in a PLL with more than one pole at the origin, such as a type II loop.

FIG. 6 is a flow chart illustrating an embodiment of a process for phase clipping in a PLL with more than one pole at the origin, such as a type II loop. In some embodiments, the phase clipping logic 310 of FIG. 3 implements the process of FIG. 5. In the example shown, upon receipt of a timing packet (402), the current value of a counter incremented by the local oscillator is read. In some embodiments, a counter value of 0 (zero) at receipt of the timing packet indicates the local oscillator is synchronized with the reference. In some embodiments, the counter starts at 0 and increments to a value of N before rolling over to 0 again, where N is the value of the loop divider and the output frequency is equal to the reference frequency multiplied by N. A value of the counter that is greater than 0 at the time of receipt of the timing packet in some embodiments indicates the local oscillator is running faster than the reference clock (jitter and long term changes in average transmission delay aside); and conversely a counter value that is "less" than 0 (i.e., counter had not rolled over to zero by the time the timing packet arrived) indicates the local oscillator is running slower than the reference clock and needs to be sped up. If the difference between the expected counter value (i.e., zero) and the actual absolute value exceeds a prescribed maximum absolute value (406), the error is set to be equal to the maximum error with a polarity corresponding to the polarity of the counter value, relative to zero (408). The resulting clipped error is provided as the error input to the loop filter (410). In some embodiments, the maximum error is determined by determining a range of error it is anticipated the oscillator may be expected to exhibit by virtue of its nature, design, materials, and other characteristics, as well as the range of environmental conditions, etc., in which it will be operating, and analyzing and/or observing the characteristics of the network (or other transmission path) via with the reference is to be provided. One embodiment, for example, uses timing packets transmitted at a 1 Hz rate and a voltage controlled oscillator (VCO) with a 10 MHz center frequency. In this case the loop divider N equals 10e6. That is, the feedback signal counter counts from 0 to 9,999,999 and then rolls over back to 0. There are several criteria which might dictate the selection of a clipping threshold, since the clipping threshold affects several performance characteristics such as maximum peak-to-peak output frequency jitter (relatively short term frequency variations), the transient response to relatively large phase errors, etc. Some of these characteristics will be addressed below.

Alternatively the value of N might be a continuously running count or phase such as, for example, the current time which may include nanoseconds through seconds, minutes, hours, days, months and years. For such an embodiment, the signal feedback counter does not normally roll over in operation but rather is large enough that it will not roll over for very long time intervals. In this case, the signal feedback counter would be preset with an estimate of the current time, such as GMT. For this embodiment, the timing packets would contain phase information in the payload in the form of the current time. The difference between the time reading of the signal feedback counter when a timing packet is received by a BTS and the time contained in the payload of the timing packet would represent the phase error and would be subject to phase clipping in accordance with the present invention. As the PLL described in this embodiment becomes substantially phase locked, the time indicated by the signal feedback counter would include the transport delay of the timing packets through the network. For a more accurately synchronized time or phase, relative to the timing packet source, loopback delays can be measured through the network, in which an assumption is made that ½ of the average of the loopback delays is equal the one-way transport delay of timing packets to the BTS. The computed one-way transport delay can then be subtracted from the time when a timing packet is received by a BTS in order to compensate for the estimated transport delay of the timing packets. This assumption is not always valid for an Internet network path, nonetheless it can often provide the BTS with a more useful approximation of the actual time at the timing packet transmitter.

Phase error clipping effectively alters the loop gain of a PLL depending on the standard deviation of phase reference jitter. In general, for a type II PLL, as the phase reference jitter increases, the phase detector gain effectively decreases. This is because the phase error median, which is tracked as a function of the clipping threshold, is estimated accurately over a longer time interval as the jitter increases. This can be modeled as a reduction in the phase detector gain.

Figure 7A:
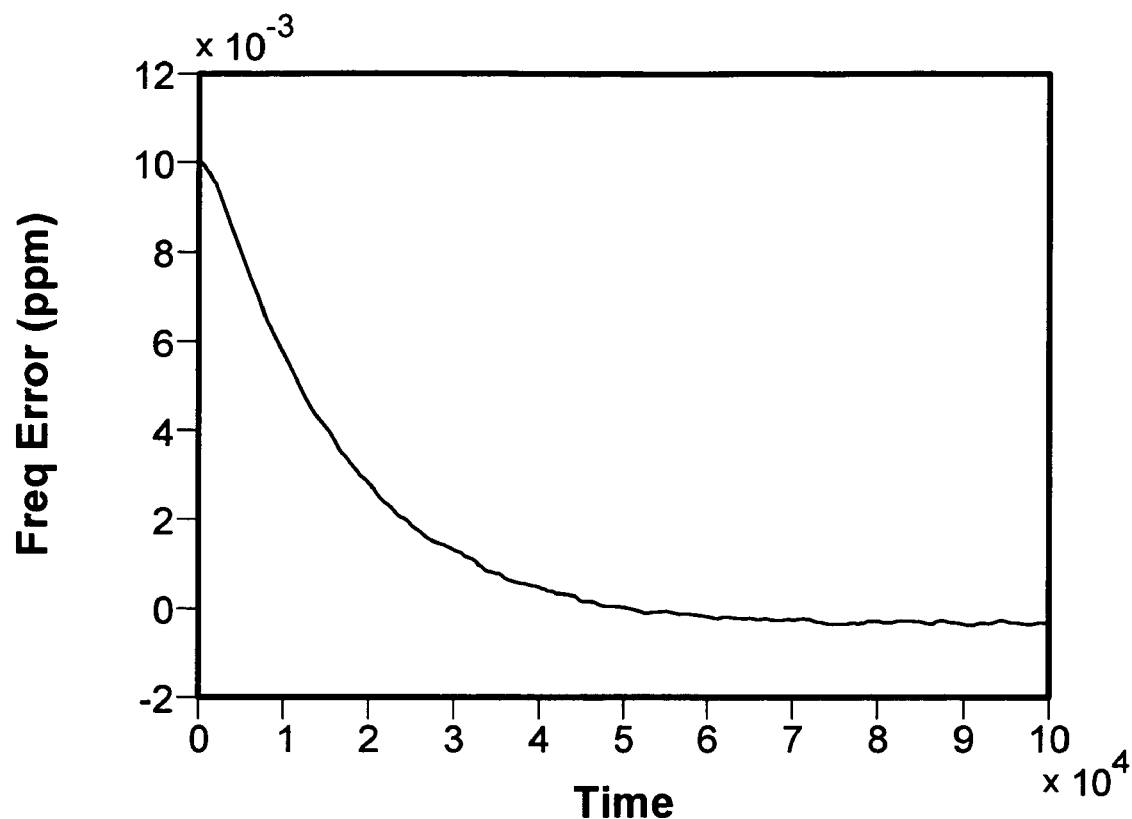
FIG. 7A depicts the frequency error response of a type II PLL with a phase detector which does not clip phase error.
Figure 7B:
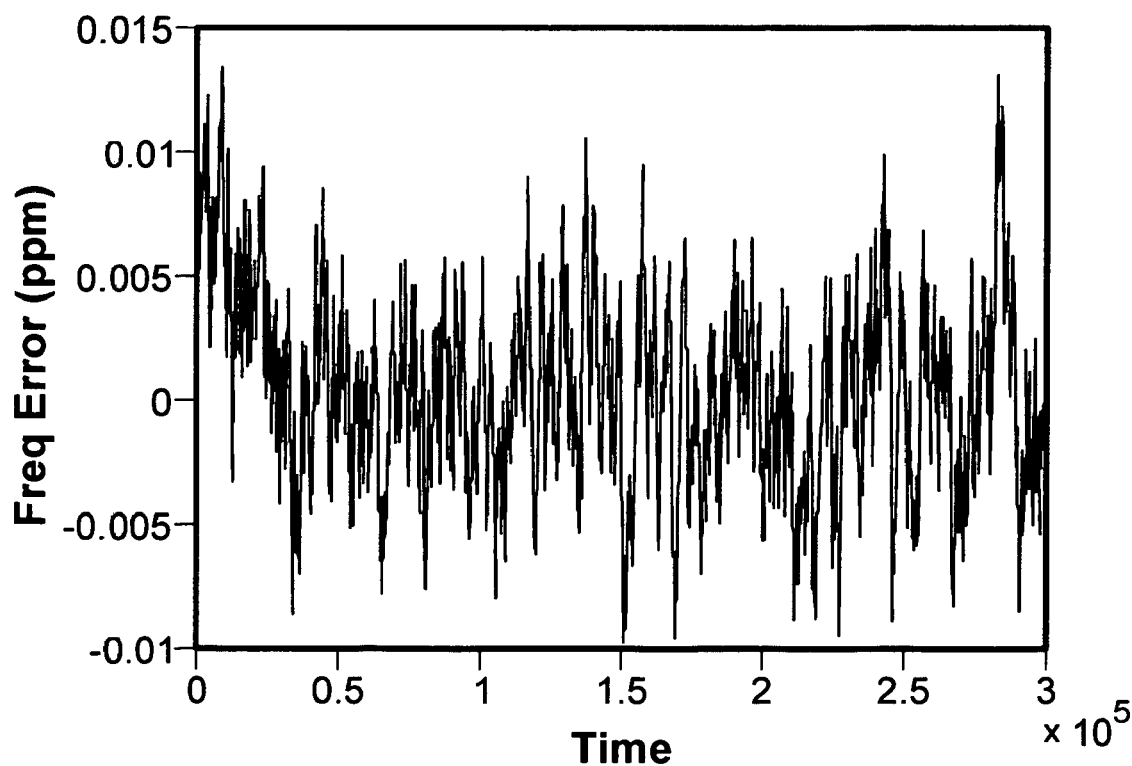
FIG. 7B depicts the frequency error response of a PLL with the same configuration as in FIG. 7A but where the jitter has a σ of 3 ms.
Figure 8A:
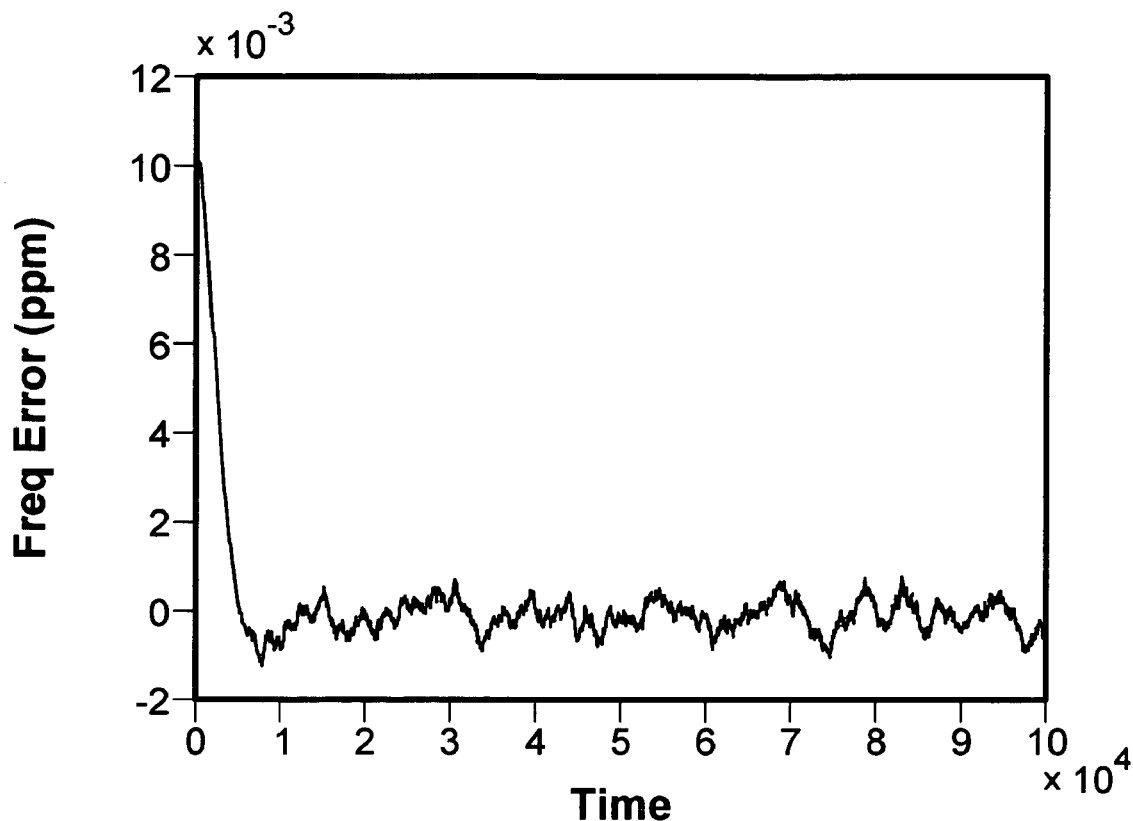
FIG. 8A depicts the frequency error response of a type II PLL with a clipped phase detector to a phase reference that includes jitter having a σ of 30 us.
Figure 8B:
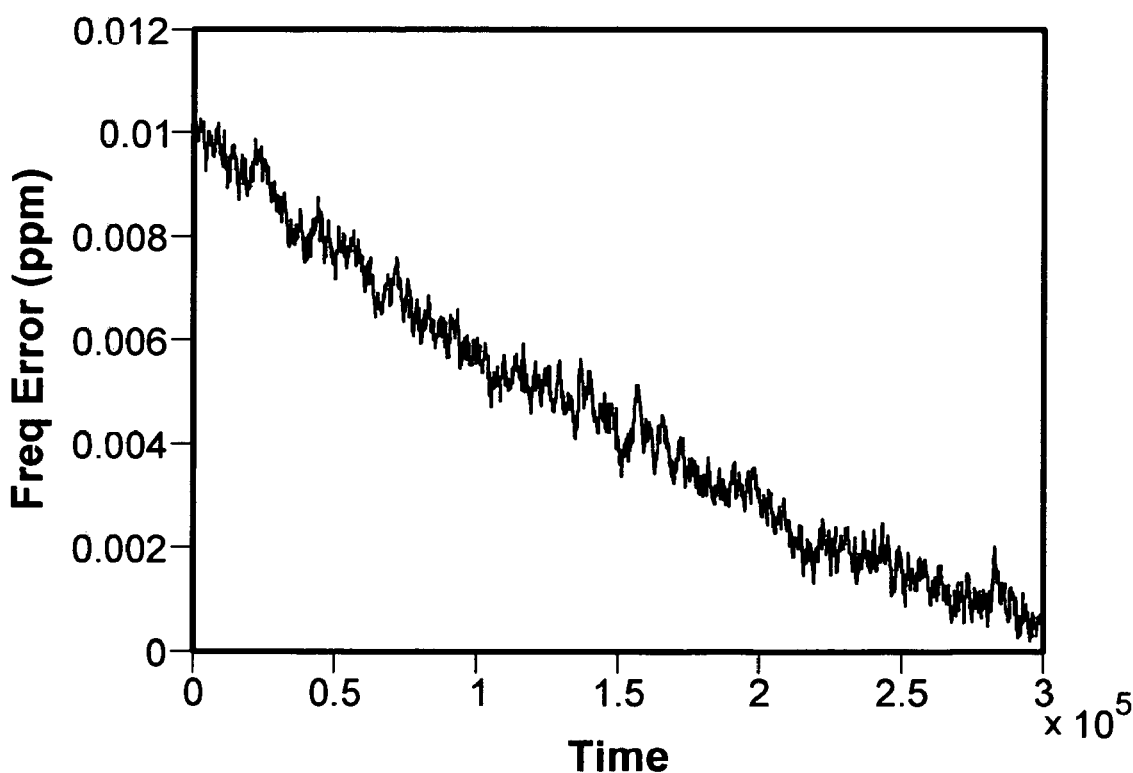
FIG. 8B depicts the frequency error response of the type II PLL of FIG. 8A to a phase reference that includes jitter having a σ of 3 ms.

FIG. 7A depicts the frequency error response of a type II PLL with a phase detector which does not clip phase error. In FIGS. 7A-10C, the y-axis corresponds to frequency error in parts per million (ppm) and the x-axis is time. In FIG. 7A, the phase reference includes jitter having a normal distribution with a standard deviation ($\sigma$) of 30 us. FIG. 7B depicts the frequency error response of a PLL with the same configuration as in FIG. 7A but where the jitter has a $\sigma$ of 3 ms. It can be seen that the peak-to-peak frequency error increases proportionally as the jitter $\sigma$ increases. FIG. 8A depicts the frequency error response of a type II PLL with a clipped phase detector. The clipped PLL used for the simulation data provided in FIG. 8A has a small signal loop gain (for phase errors which are less than the clipping threshold) which is 1000 times greater than that used in FIGS. 7A and 7B. In FIG. 8A, the phase reference includes jitter having a $\sigma$ of 30 us. While the peak-to-peak frequency error for the clipped PLL in FIG. 8A is less than 5 ppb, this is still larger than that of the conventional PLL reflected in the frequency error response in FIG. 7A. This is because of the relatively large small-signal forward loop gain of the PLL used in FIG. 8A. It can also be seen in FIG. 8A that the clipped PLL tracks out the initial frequency error of 10 ppb much faster than the conventional PLL used in FIG. 7A. Once again, this is due to the relatively larger forward loop gain and the resultant larger small signal bandwidth of the clipped PLL. FIG. 8B depicts the frequency error response of the same clipped PLL used for the data provided in FIG. 8A. As in FIG. 7B, the jitter $\sigma$ in FIG. 8B is equal to 3 ms. It can be seen in FIG. 8B that the peak-to-peak frequency remains less than 5 ppb as in FIG. 8A. It can also be seen that the transient response time of the clipped PLL increases in FIG. 8B compared with FIG. 8A. For phase errors that are substantially equal to or less than the phase clipping threshold, the phase detector gain can be modeled as variable according to the standard deviation of the phase reference jitter as previously described.

When timing packets are distributed in certain network paths, such as the Internet, relatively large and long term changes in network transmission delay can be introduced in the network path. Many things can occur in an Internet connection, which are difficult to anticipate and which cause the delay of a logical network channel to alter significantly. Such things may include long-term Internet traffic variations, modified hardware configurations and variable network routes. It is desired that the tracking loop will not respond to relatively large and long term delay variations to the extent that an unacceptable frequency error results in the output. For a PLL with phase error clipping, when the phase error exceeds the phase clipping threshold and the standard deviation of the phase reference jitter, the effective phase detector gain begins to decrease linearly.

Figure 9A:
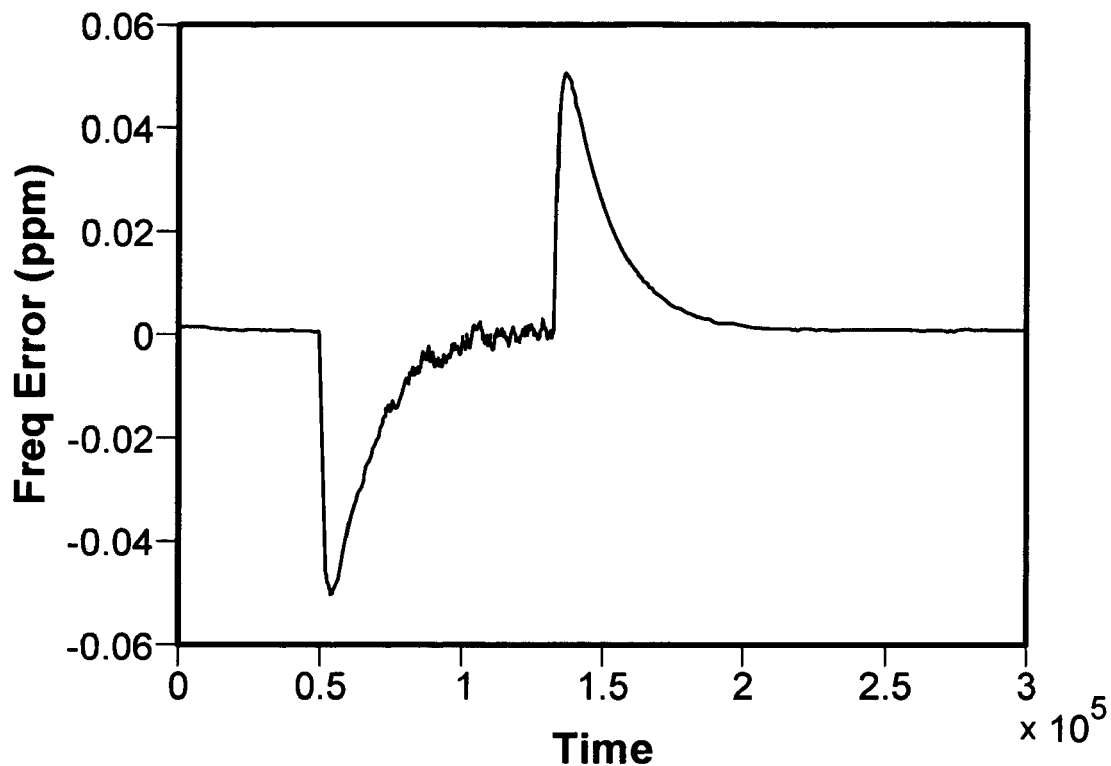
FIG. 9A depicts the response to a 1 mS delay of a PLL having the same configuration as that used to predict the responses provided in FIGS. 7A and 7B.
Figure 9B:
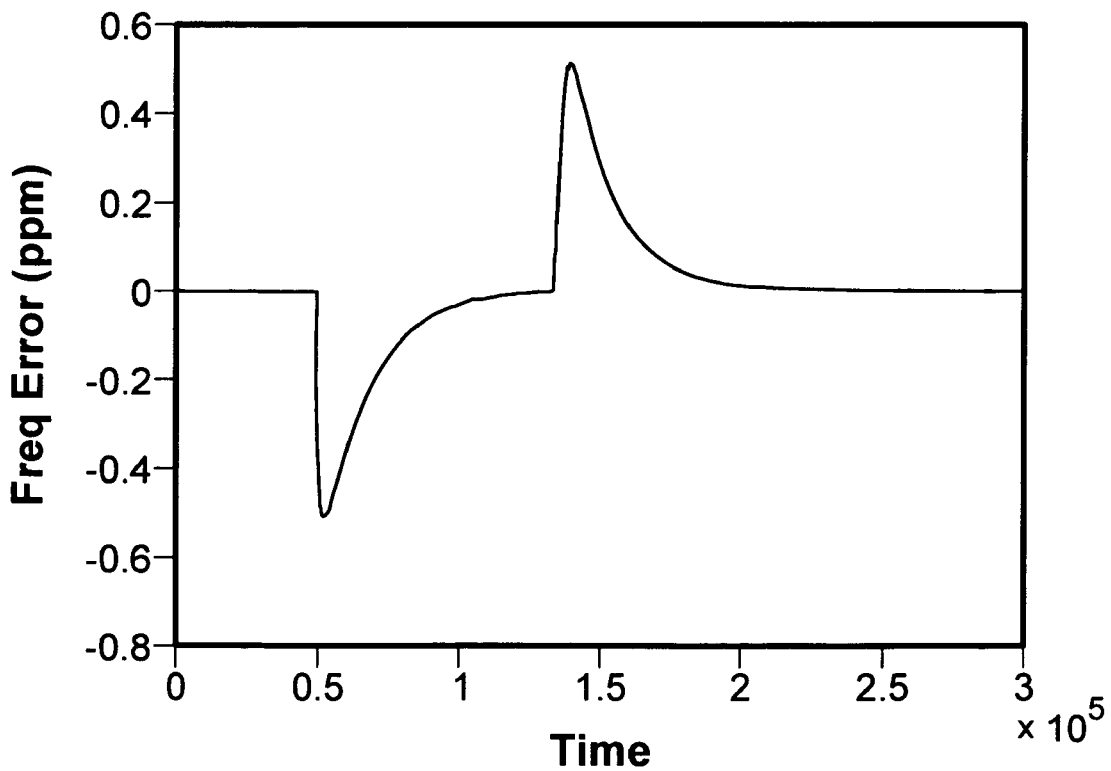
FIG. 9B depicts the frequency error response of the PLL of FIG. 9A in which added delay of 10 ms is introduced for 24 hours.

FIG. 9A depicts the response of a PLL having the same configuration as that used to predict the responses provided in FIGS. 7A and 7B. In FIG. 9A, a 1 ms delay is introduced. The added delay has a duration of 24 hours, after which the delay returns to the initial value. It can be seen that the PLL responds to the added delay by significantly decreasing the output frequency in order to track the new phase reference. In this case a temporary frequency error of approximately –0.05 ppm results at time 50K seconds when the 1 mS delay is introduced. A frequency error of +0.05 ppm can also be seen when the added delay is withdrawn. This is because the PLL attempts to track out the new phase reference by steering the output frequency accordingly. FIG. 9B depicts the frequency error response of the same PLL in which added delay of 10 ms is introduced for 24 hours. It can be seen in FIGS. 9A and 9B that the PLL peak-to-peak frequency error increases in direct proportion to the magnitude of the added delay of the timing packets. In FIG. 9B, the maximum peak frequency error is 0.5 ppm.

Figure 10A:
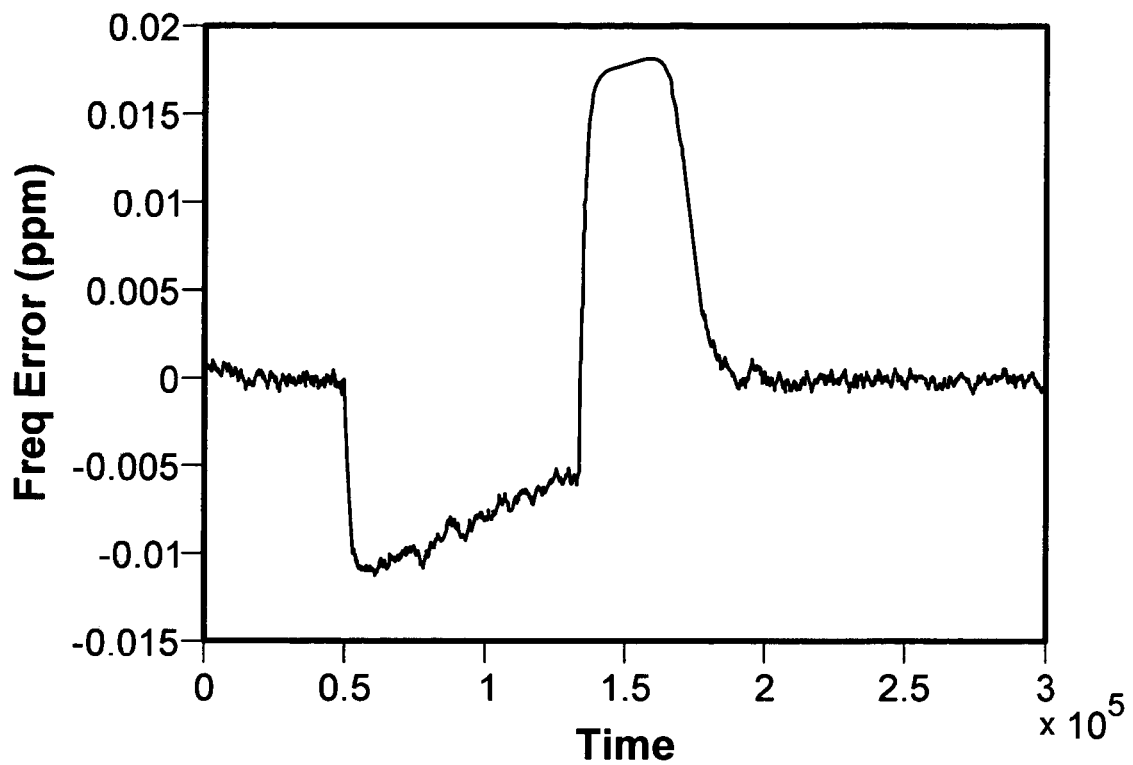
FIG. 10A depicts the response of a clipped PLL, having the same configuration as that used to predict the responses shown in FIGS. 8A and 8B, to a 1 ms delay added to the phase reference.
Figure 10B:
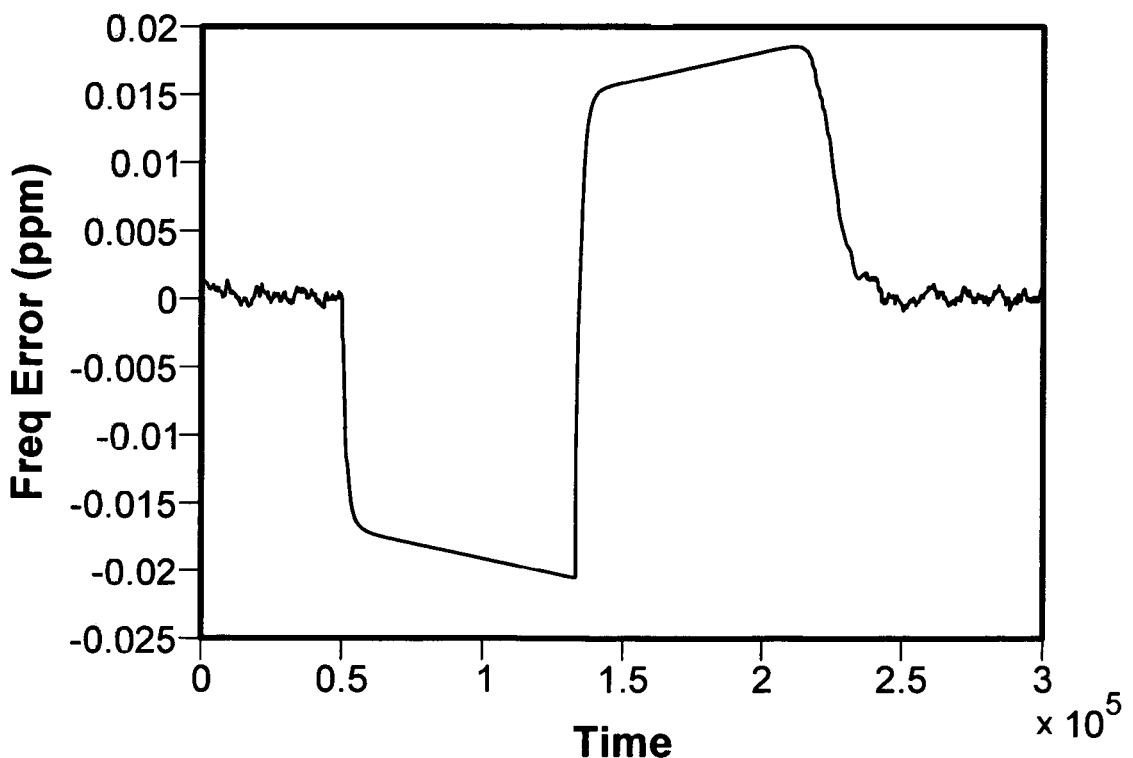
FIG. 10B depicts the response of a clipped PLL, having the same configuration as that used to predict the responses shown in FIGS. 8A and 8B, to a 10 ms delay added to the phase reference.

FIG. 10A depicts the response of a clipped PLL having the same configuration as that used to predict the responses shown in FIGS. 8A and 8B. In FIG. 10A, a 1 ms delay is added to the phase reference. In FIG. 10A, the PLL with phase error clipping initially responds relatively quickly when the delay is introduced at time 50K seconds, with a steep variation in frequency error. However, the slope of the frequency error becomes abruptly gradual after approximately 1000 seconds, after which the PLL begins to track out the phase error. After approximately 24 hours (83,000seconds), the 1 mS delay is removed and the PLL responds with a temporary positive frequency error, which is tracked out. The peak frequency error due to the added 1 ms delay is approximately –12 ppb; In FIG. 10B, the same clipped PLL is subject to a phase reference having an added delay of 10 ms over 24 hours. In FIG. 10B, the 10 ms added delay exceeds the maximum jitter of the phase reference, which results in a smooth response by the clipped PLL shortly after the added 10 mS delay is introduced. In this case, the PLL with phase error clipping again responds initially with a rapidly decreasing frequency error for approximately 800 seconds. In FIG. 10B, the slope of the frequency error becomes abruptly more gradual after the initial response and a constant slope of approximately 3 ppb over almost 24 hours is output while the 10 mS delay persists. The maximum peak frequency error due to the added 10 mS delay is approximately –21 ppb. In FIG. 10B, the frequency error becomes positive at time 133 K seconds, when the added delay is removed. This frequency error transition occurs because the phase of the clipped PLL has tracked the 10 ms delayed phase reference for a long enough time that, when compared to the initial phase reference, which is re-established at time 133K, the detected phase error exceeds the phase error clipping threshold. Thus, the clipped PLL begins to track out the phase error introduced by the added delay and goes into the opposite polarity nonlinear region of the clipped phase detector for approximately 24 hours before the phase error is once again within the phase clipping thresholds.

Figure 10C:
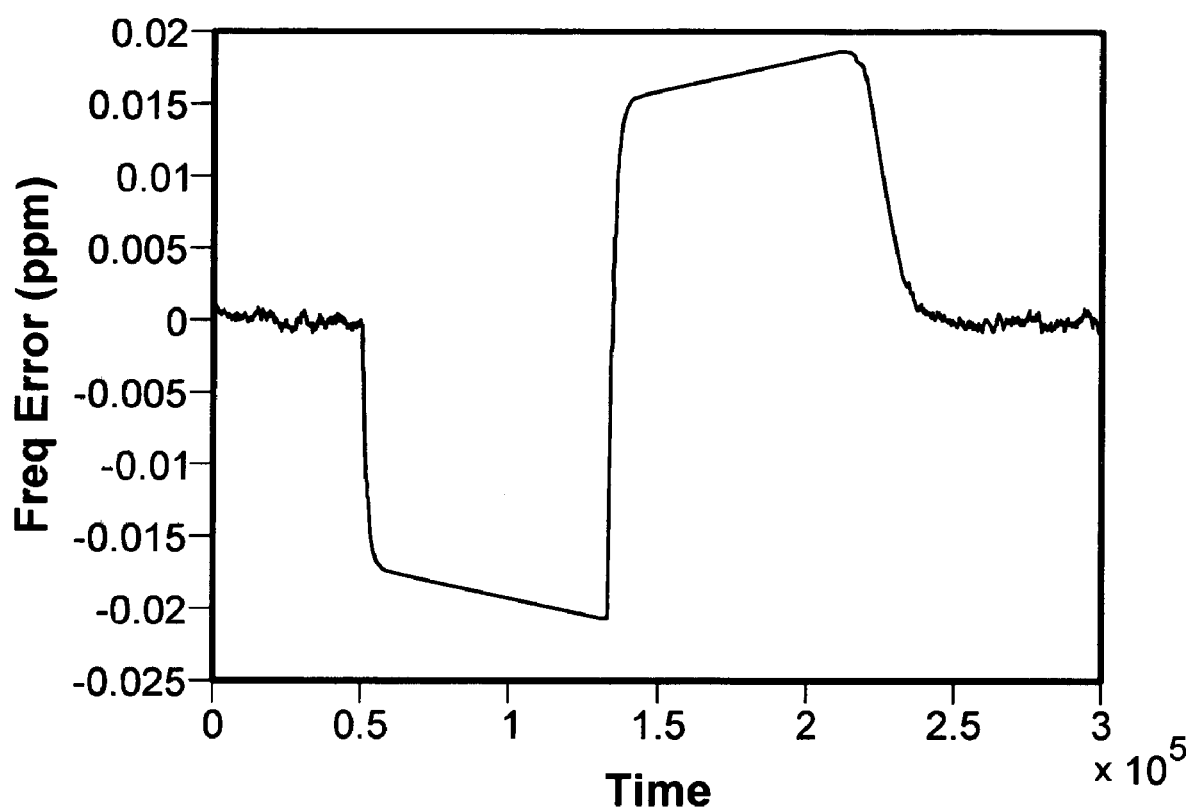
FIG. 10C depicts the response of the clipped PLL of FIGS. 10A and 10B to an added delay of 100 mS.

FIG. 10C depicts the clipped PLL response to an added delay of 100 mS. It can be seen that the frequency responses depicted in FIGS. 10B and 10C are substantially equivalent. The substantially equivalent responses in FIGS. 10B and 10C indicate that the response of a particular PLL with phase error clipping is substantially the same for any long term delay variations of corresponding polarity, which substantially exceed both the clipping threshold and the jitter $\sigma$ of the timing packets.

It may occur that a significant and very persistent—perhaps even permanent average delay is introduced the timing packet network path. In such cases, a PLL will be forced to track out the new average delay of the network path. This can potentially result in a peak frequency error that exceeds a desired frequency error limit. In some embodiments a resynchronization event is employed to reduce the possibility of a large and persistent network delay causing an excessive deviation of the output frequency of the PLL.

A resynchronization event may be triggered in several ways. For example, a resynchronization event may be configured to occur periodically each hour or perhaps every 16 hours or 24 hours. Alternatively resynchronization events may be triggered over pseudorandom intervals. Preferably, a resynchronization event utilizes previous phase measurements to be used as a starting reference for future phase measurements. In particular the median of previous phase measurements can be the most accurate phase reference for a PLL with phase error clipping in which relatively small clipping thresholds are set. For a PLL without phase error clipping or for a PLL with phase error clipping but with large clipping thresholds relative to the σ of phase reference jitter, the average of previous phase measurements can be the most accurate phase reference for a resynchronization event. Still another trigger, which may be used to cause a resynchronization event, is a phase error of a predetermined magnitude which persists over a predetermined interval. For a type II PLL with a relatively narrow clipping threshold, it may be detected that the phase error becomes limited continuously and constantly over a given interval. Such a limiting condition may be due to a frequency error of the clipped PLL or may be due to a network delay, which has significantly altered the average transport delay of timing packets. If a PLL is resynchronized relatively often, then the effective transient response of the loop may increase and frequency errors will take more time to be tracked out. Also, once a PLL is resynchronized to a given phase reference for timing packets, the network transport delay might change yet again, in which case the new phase reference may no longer be accurate. One technique that may be used to combat this situation is to delay the phase error measurements for a predetermined time interval, for example 15 minutes, so that a decision can be made as to whether the delayed phase error measurements should be applied with respect to a new phase reference before the phase error measurements are actually applied to the PLL. In general, there are several methods by which a resynchronization event may be triggered. Factors which may influence the choice of a particular embodiment include the environment of a target application, the tolerances of an application, the behavior of the particular circuits employed and the PLL design parameters.

Figure 11:
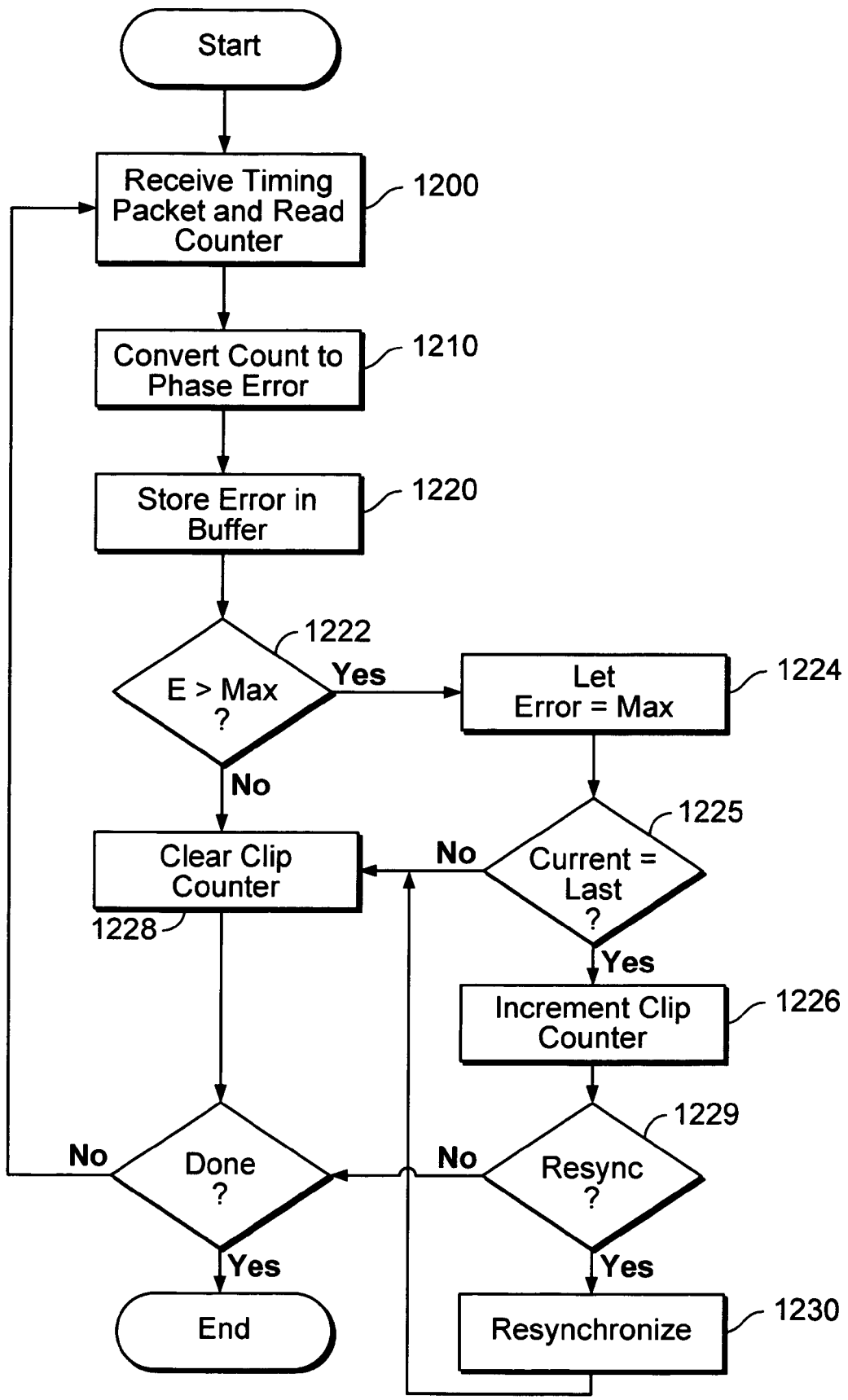
FIG. 11 is a flowchart that depicts one embodiment of processing performed by a type II PLL with phase clipping in which a resynchronization event is triggered by PLL phase error limiting over a predetermined maximum interval.
Figure 12A:
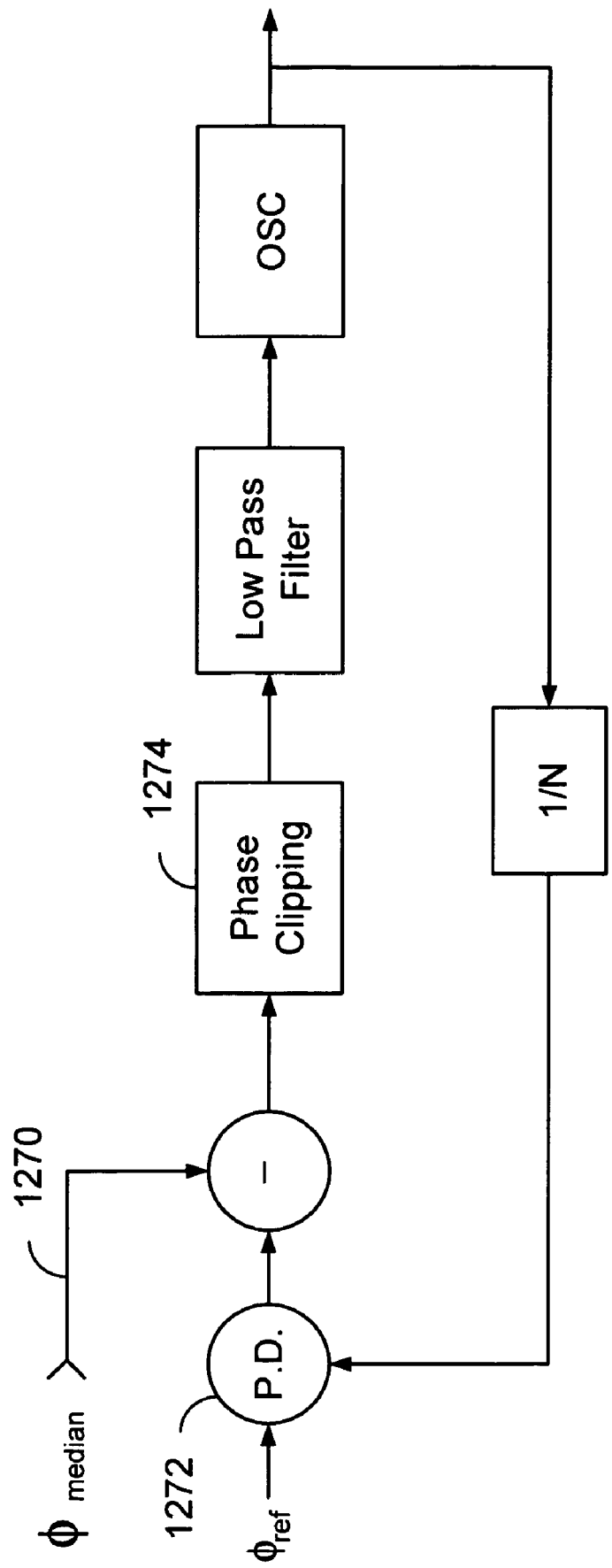
FIG. 12A is a block diagram illustrating an embodiment of a PLL with phase error clipping in which an estimated phase median is subtracted from the output of the phase detector.

Referring to FIG. 11, a flowchart depicts one embodiment of processing performed by a type II PLL with phase clipping in which a resynchronization event is triggered by PLL phase error limiting over a predetermined maximum interval. In FIG. 11, a timing packet is received by the BTS PLL and the loop divider count is read (1200). Then the count is converted to phase error with respect to the value 0 (1210). The maximum value of the counter is N, after which the counter will roll back over to zero and resume incrementing by 1 for each output cycle of the VCO. Each value of the detected phase error is stored in a buffer (1220). The phase error conversion is such that if the counter value is "400" when the timing packet is received, i.e., the counter rolled passed zero and incremented up to 400 before the next timing packet was received, the phase detector will output "−400", to steer the VCO to a lower output frequency, assuming that the VCO has a positive voltage to frequency gain. If the counter value is "N−8", i.e., the counter was a count of 8 short of rolling over to zero at the time the timing packet was received, the phase detector will output "8" to steer the VCO to a higher output frequency, once again assuming that the VCO has a positive voltage to frequency gain. Next the phase error is clipped according the absolute value of the clipping threshold "C" (1222 and 1224). For the phase error examples above, assume the clipping threshold absolute value is 3. Then, for the phase detector output of "−400", the clipped phase detector output will be "−3". For the phase detector output of "8", the clipped phase detector output will be "3". The value of each clipped phase detector output is compared with the previous value of the clipped phase detector output (1225). If the current value is equal to a maximum clipping threshold and is also equal to the previous clipped phase detector output, then a clip-counter is incremented (1226). If the current value is not equal to a maximum clipping threshold or is not equal to the previous clipped phase detector output, then the clip-counter is cleared (1228). If the clip-counter reaches a predetermined resynchronization trigger interval, then a resynchronization event is engaged and the clip-counter is cleared (1230). In some embodiments, the resynchronization event sorts the stored phase detector error outputs in ascending order and finds a median value. The median value is then constantly subtracted from the output of the phase detector before it is clipped. The example described above is one of many possible methods and embodiments of triggering and executing a resynchronization event. For example, instead of subtracting a calculated phase error median to the phase detector output, the loop divider counter could be reset at a particular time, such that it is synchronized with the calculated phase median. Referring to FIG. 12A, an estimated phase median is subtracted (1270) from the output of the phase detector (1272). If the PLL did not include phase error clipping (1274) or has relatively large phase error clipping thresholds, then the phase error mean may be calculated and subtracted from the phase detector output, instead of the phase error median. Further, rather than count the number of constant clipped values output from the clipped phase detector, a resynchronization event may be triggered by other thresholds or by other means. Such as substantially periodic resynchronization or by a frequency error estimator, in which a particular estimated frequency error over a particular interval, would trigger a resynchronization event. Some examples of frequency error estimation are discussed below.

Figure 12B:
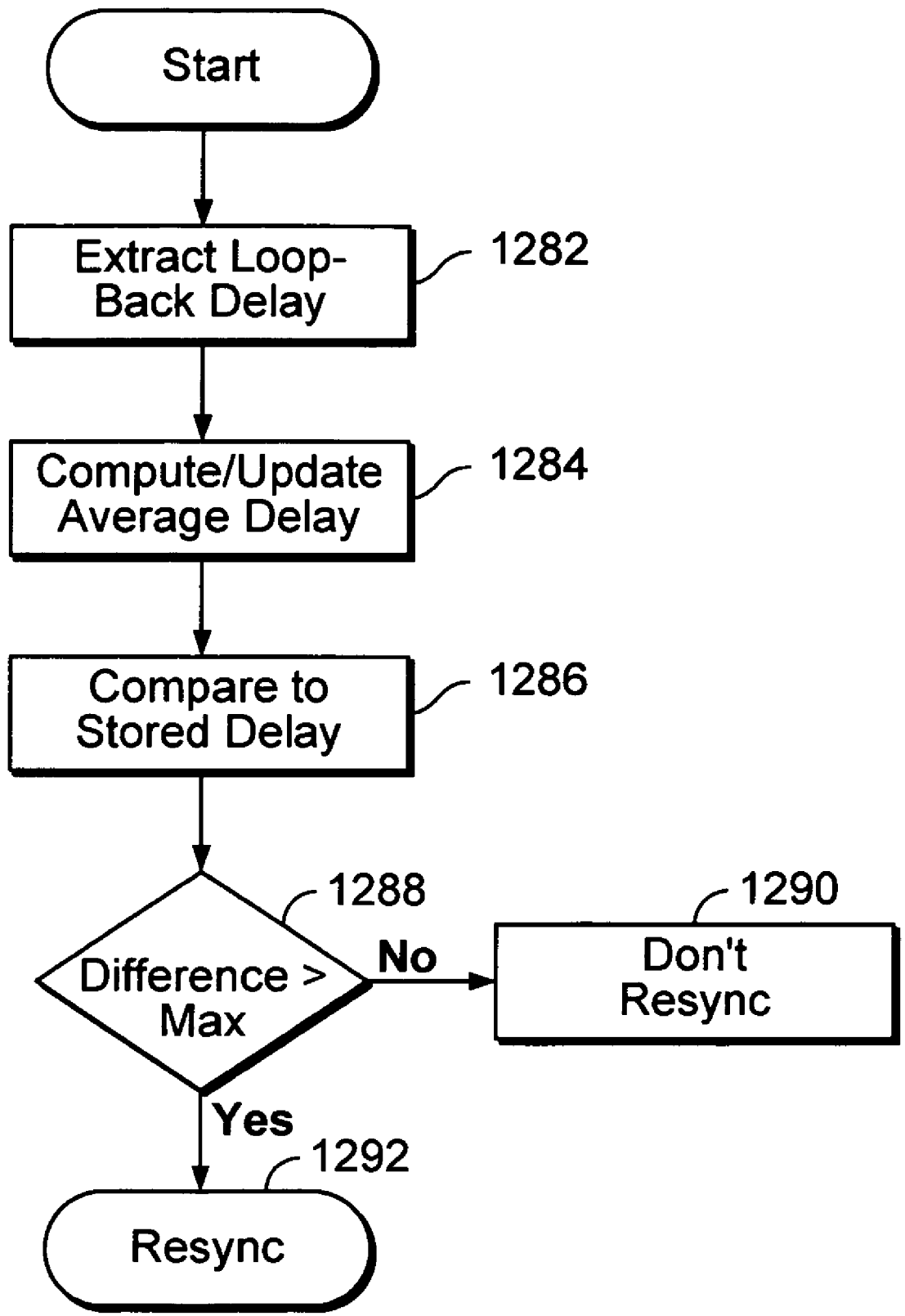
FIG. 12B is a flow chart illustrating an embodiment of a process for determining whether a criterion to resynchronize a PLL has been satisfied.

FIG. 12B is a flow chart illustrating an embodiment of a process for determining whether a criterion to resynchronize a PLL has been satisfied. At 1282, a loop back delay data is extracted (e.g., by parsing or reading a header and/or other formatted data field) from a timing packet. A loop back delay is the measured time starting with an initial transmission of a packet by a first node to a second node and ending when a response is received by the first node from the second node. At 1284, the loop back delay extracted in 1282 is used to compute or update a long term average (or median) transmission delay for a current (or just ended) period, e.g., the last fifteen minutes. At 1286, the average (or median) transmission delay computed and/or updated in 1284 is compared to a corresponding stored long term transmission delay for a previous (e.g., an immediately previous) period. If it is determined at 1288 that the difference between the two is less than or equal to a prescribed maximum difference, it is concluded at 1290 that resynchronization should not be performed. If it is instead determined at 1288 that the difference between the two is greater than the prescribed maximum difference, it is concluded at 1292 that resynchronization should be performed.

Figure 12C:
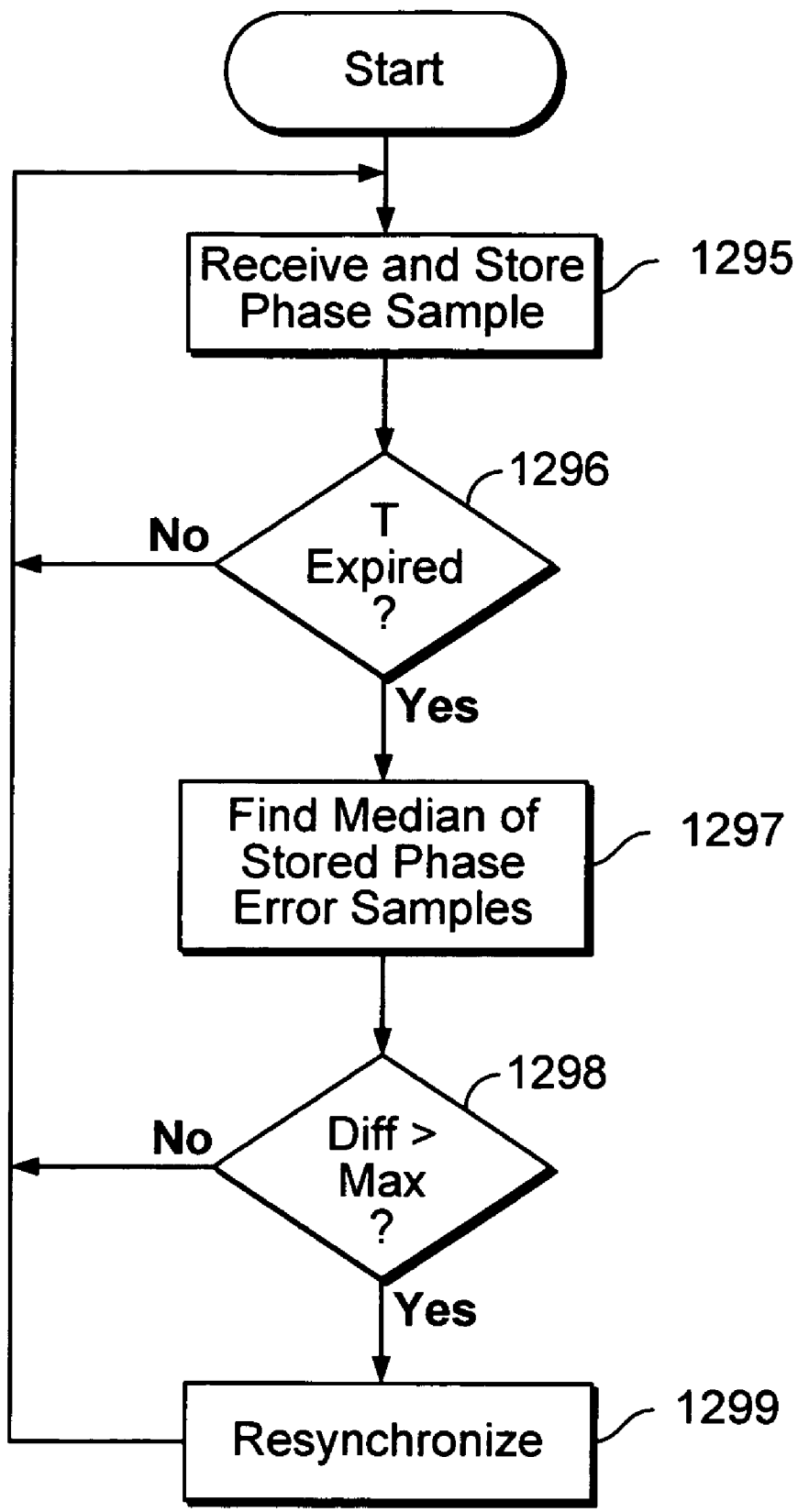
FIG. 12C is a flow chart illustrating another embodiment of a process for determining whether a criterion to resynchronize a PLL has been satisfied.

FIG. 12C is a flow chart illustrating another embodiment of a process for determining whether a criterion to resynchronize a PLL has been satisfied. At 1295 the unclipped phase error is stored in memory as phase error samples are obtained. When a predetermined time interval expires (1296), the median of the stored phase error samples is determined (1297). Next, the phase error median is compared with a previously computed phase error median and the difference is compared with a predetermined threshold. If the difference exceeds the threshold (1298), then the new phase error median is used to resynchronize the PLL by, for example subtracting the new phase error median from the output of the phase detector (1299).

As shown in FIGS. 10A, 10B and 10C a PLL with phase clipping will respond to a relatively large and significant phase reference alteration with a clipped response, compared with the response of a normal PLL. As described above, such a phase reference alteration may be caused by a new average delay in the reception of timing packets. In FIGS. 10A, 10B and 10C, the PLL output frequency changed significantly soon after the change in the phase of the reference. Then, after the initial response of the PLL, the PLL output frequency changed at a much lower rate over time. For a type II loop, the long-term pulse or step-like response of the PLL with phase error clipping can be shaped or formed with respect to the initial magnitude of the frequency step output and also with respect to the long term slope of the frequency step for phase reference time shifts which substantially exceed the phase error clipping thresholds plus the jitter σ. The main PLL parameters which can be used to control the characteristics of the frequency step output are: zero placement, phase detector gain and the phase error clipping threshold. Some considerations with respect to the selection of these parameters are discussed below.

For a type II PLL, an integrator is added, which provides an additional pole at the origin of the s-plane. Typically the integrator is associated or grouped with the loop filter, coupled to receive the phase detector output. Because of the additional pole at the origin, the PLL will exhibit an inherent phase shift of 180 degrees. Because of negative feedback, a PLL will be unstable when a phase shift of 180 degrees exists at the unity gain frequency. In order to stabilize the loop, a zero is added to cancel out the added pole at the origin such that the phase shift will be less than 180 degrees at the unity gain frequency. If the zero is actually placed at the origin, then the loop becomes a type I loop, since the zero will completely cancel the added pole at the origin. Based on the design criteria for a particular type II PLL, the optimal placement of the zero will vary. For a PLL using a packet-based network path, such as the Internet, an important criterion might be the response of the loop to a long term phase shift of the reference due to a change in the average delay of timing packets. The most important criterion will typically be the stability of the loop, which will dictate a maximum frequency at which the zero may be placed. Within the region of the stability, the zero can also be placed with respect to a desired damping factor. However the precise placement of the zero between the maximum frequency and DC can further be chosen with respect to the desired long term slope of the output frequency step due to a long term phase reference shift.

Figure 13:
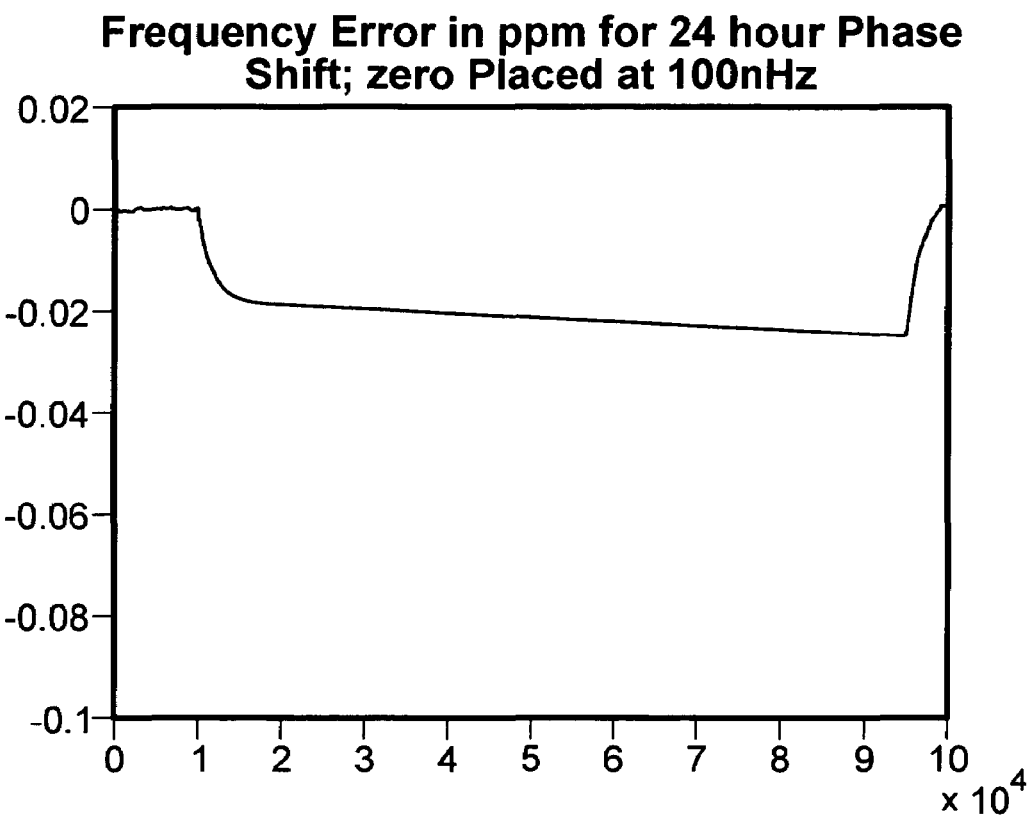
FIG. 13 shows a transient response of the output frequency error to a 24 hour phase shift for a PLL with phase error clipping.
Figure 14:
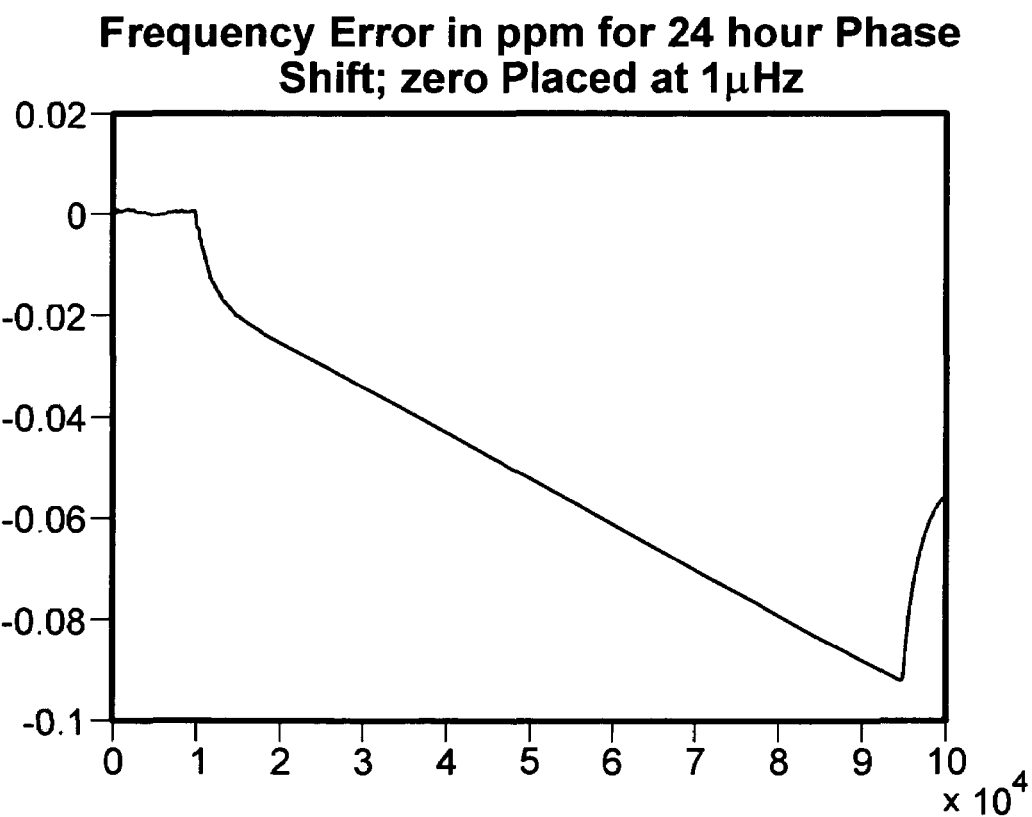
FIG. 14 shows a transient response of the output frequency error to a 24 phase shift for a PLL with phase error clipping and the zero placed at 1 uHz.

The gain of the phase detector and the selection of the phase error clipping thresholds are influenced by several factors such as stability and transient response for the former and maximum output frequency jitter for the latter. However the gain of the phase detector as well as the phase error clipping thresholds also determine the magnitude of the initial frequency step response due to long term phase reference shifts, as well as the long term slope of the output frequency step. For example, assume a phase clipping threshold is selected such that phase errors, which correspond to a time difference of greater than 300 ns or less than −300 ns are clipped. Also assume that the phase detector gain is 60,000 V/s. If the VCO gain is 1 ppm (Hz)/V, then the maximum initial frequency step due to a long term phase shift is: −300e-9*60e3*1 ppm (Hz)=−18 ppb (Hz). Further assume that a zero is placed at $(s/\omega_z+1)$ in the s-domain where $\omega_z$ equals 2π*100 nHz. If the zero is implemented digitally, the matched-z transform becomes: $(1+0.999995*z^{-1})$. Given the above assumptions and a 1 Hz sample rate, the maximum long-term slope of the frequency step output due to long-term reference phase shifts is: 300e-9*60e3*1 ppm (Hz)*(1−0.999995)=90e-9 ppm (Hz)/second. Over 24 hours, this results in an output frequency variation of 3600 sec*24*−90e-9 ppb or −7.8 ppb due to the maximum long-term slope of the frequency step. Assuming a steady-state initial condition, the total maximum output frequency deviation due to a large, long term reference phase shift is equal to the maximum initial frequency step plus the long-term slope or −25.8 ppb. A transient response of the output frequency error to a 24 hour phase shift for a PLL with phase error clipping and with the parameterization of the above example is provided in FIG. 13. Alternatively, if the zero is moved to 1 uHz, then the transfer function of the zero in the z-domain becomes $(1+0.99995\ z^{-1})$ and the maximum long-term slope of the frequency step output due to long-term reference phase shifts is: −300e-9*60e3*1 ppm (Hz)*(1−0.99995)=−900e-9 ppm (Hz)/second. Over 24 hours, this results in an output frequency variation of 3600 sec*24*−900e-9 ppb=−78 ppb due to the maximum long-term slope of the frequency step. Thus, the total maximum output frequency deviation due to a large, long term reference phase shift is approximately equal to the maximum initial frequency step plus the long-term slope or −96 ppb. A transient response of the output frequency error to a 24 phase shift for a PLL with phase error clipping and the zero placed at 1 uHz is provided in FIG. 14. The discussion above is not representative of an exhaustive analysis of the optimal parameterization and performance of a PLL with phase error clipping. However additional insight into the effects of phase error clipping may be gained through an understanding the analysis provided.

Figure 15A:
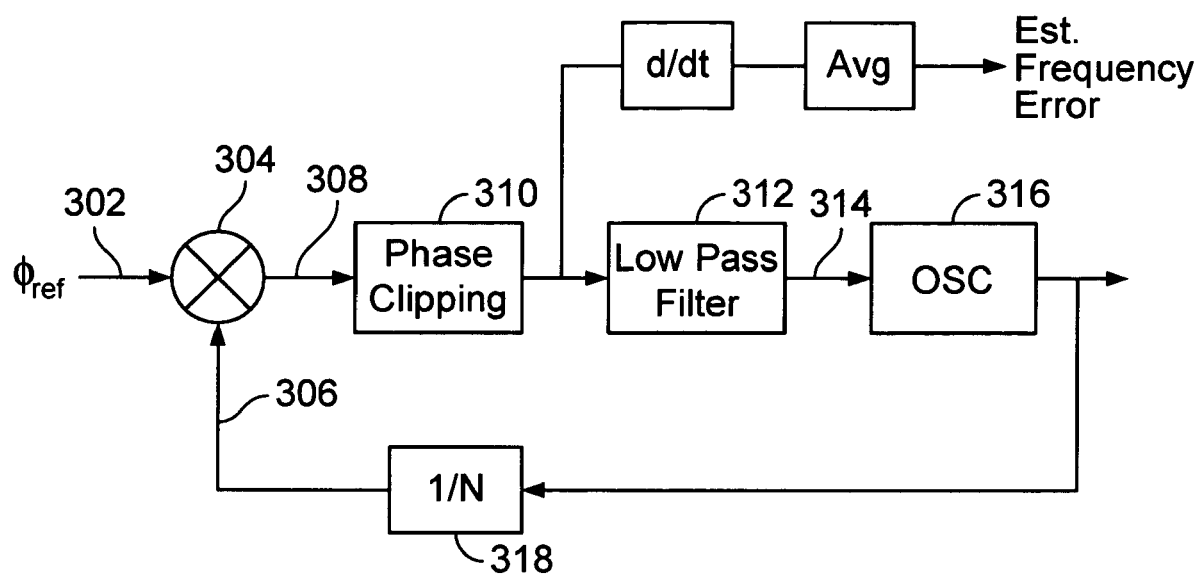
FIG. 15A is a block diagram of a PLL with phase error clipping to which a differentiator block has been added to provide an estimated frequency error.

A frequency error can be estimated by differentiating the clipped phase error and averaging using a confidence interval, for example as shown in FIG. 15A, which is expected to provide reasonably accurate frequency estimation within a desired time period. In FIG. 15A, the differentiator block (320) can be implemented digitally by summing together an instant value of the clipped phase error with the negative of a delayed value of the clipped phase error. Because none of the clipped phase error samples included in the frequency estimation average can have an extraordinarily large magnitude and consequently skew the average, a frequency estimation using clipped phase error information can be less sensitive to relatively large delay variations of timing packets than some other methods, such as mean time interval error measurements. Using clipped phase error information to estimate frequency error also limits the maximum frequency error that can be detected in direct proportion to the phase error clipping threshold. For example, if the phase error clipping threshold is set to +/−300 ns, which corresponds to +/−300 ppb, then the maximum frequency error which can be estimated is +/−300 ppb. Often however, because the frequency of a device, such as a BTS must be within a frequency limit such as +/−100 ppb, it is not necessary to provided frequency error estimations which greatly exceed the requirements of the application.

Figure 15B:
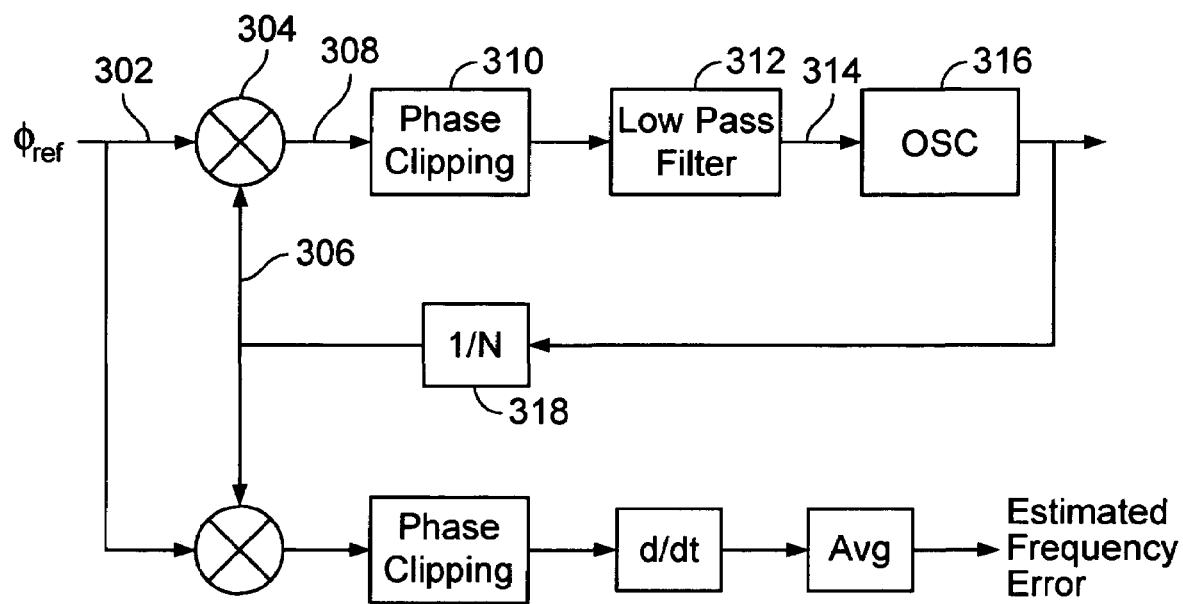
FIG. 15B is a block diagram of a PLL with phase error clipping in which a separate clipped phase detector, which is not part of the control feedback system, is used for frequency estimation.

Sometimes a PLL with phase error clipping will have a persistent phase error, due to causes such as a network delay, which persists for a relatively long period of time. When this occurs, the clipped phase detector output will limit for the duration of the network delay until either the loop tracks out the delay or until a resynchronization event occurs. For this reason, a separate clipped phase detector, which is not part of the control feedback system, can be used for the purpose of frequency estimation, as shown in FIG. 15B. A clipped phase detector used for frequency estimation can be resynchronized independently of the phase detector, which is used in the feedback control loop. This allows resynchronization events of the feedback control loop and of the frequency estimation clipped phase detector to be designed and optimized separately. The clipping thresholds used in the feedback control loop and the frequency estimation clipped phase detector can also be independently selected and optimized. For example, a clipped phase detector used for frequency error estimation can use relatively wide clipping thresholds, if desired, to extend the maximum range of frequency error estimation, without impacting the performance of the PLL. A clipped phase detector used for frequency estimation will typically operate similar to the clipped phase detector, which would be used in a type I loop.

The techniques disclosed herein are not limited to a loop having any particular number of poles at the origin, although different feedback control loop types can have different responses, some of which differ significantly. For a type I loop for example, the effective phase detector gain varies differently than for a type II loop as the phase reference jitter σ increases. Also, the response to relatively large and long-term delay variations of the phase reference can be significantly different for type I and type II loops. Loops which are higher than type III loops can also be employed with beneficial results using the methods disclosed herein. Type 0 loops can be constructed to employ the methods disclosed herein as well however, as is well known in the art, such loops exhibit a steady state error proportional to the loop gain.

Phase clipping as disclosed herein enables a PLL to lock to a phase reference, which is transported through a packet-based network while minimizing the effects of network jitter and long term delay variations on the PLL output frequency. In order to maintain a particular maximum frequency error with respect to the reference, such as 0.1 ppm, the PLL is relatively slow responding. While in many cases, the PLL transient response may be fast enough to correct long-term frequency errors such as those due to crystal aging, the loop may not be fast enough to correct frequency errors due to relatively rapid changes in temperature. In general, an oscillator that has a high degree of temperature compensation is more expensive than an oscillator that has a lesser degree of frequency error compensation with respect to temperature. Techniques to detect and correct in a relatively short period of time frequency errors caused by temperature variations are disclosed.

Figure 16:
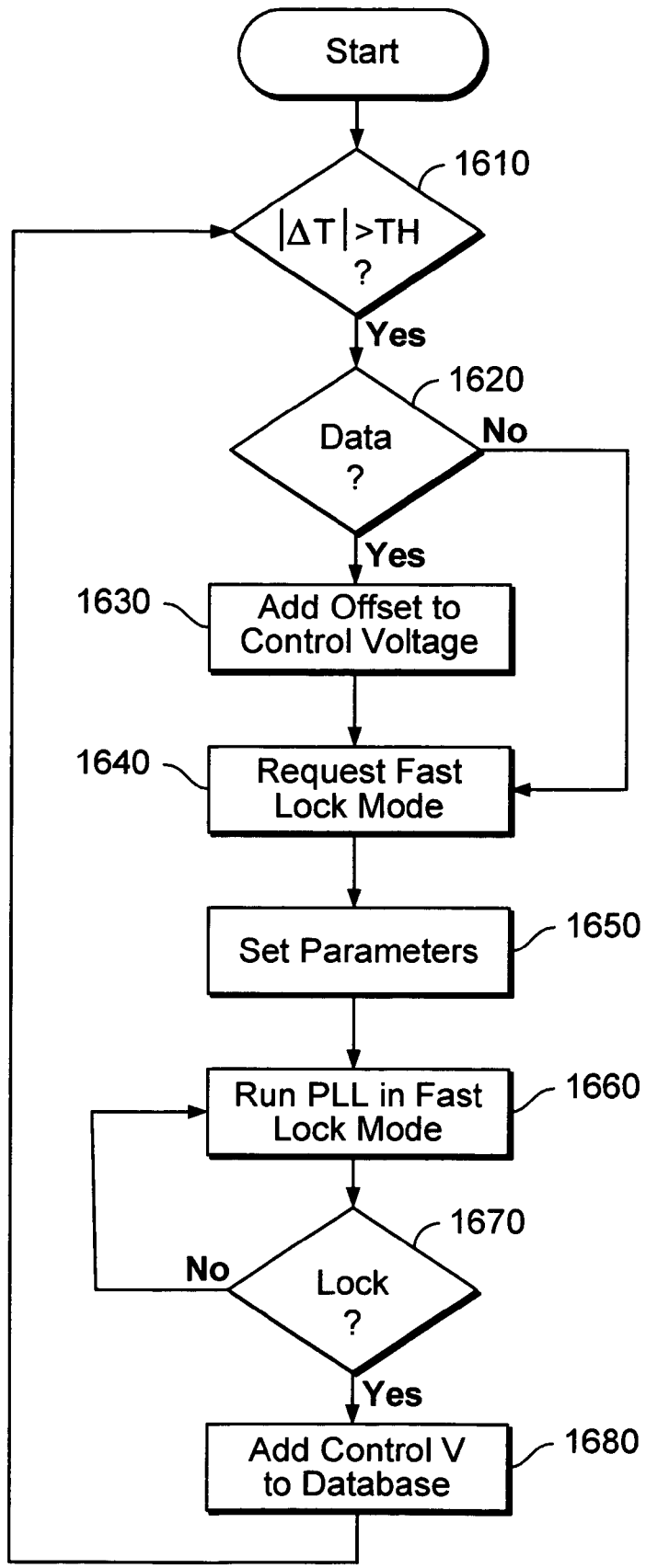
FIG. 16 depicts an embodiment of a process to detect and correct in a relatively short period of time frequency errors caused by temperature variations.

FIG. 16 depicts an embodiment of a process to detect and correct in a relatively short period of time frequency errors caused by temperature variations. Assume the method begins with the PLL in a substantially frequency locked state. The BTS monitors the temperature of the BTS in order to detect that temperature has changed by a predetermined threshold over a minimum time interval (1610). If it is detected that the temperature has changed by at least the amount of the threshold over minimum time interval, a database is examined to determine whether a predetermined estimate of the appropriate control voltage for the current temperature exists or whether enough data exists to interpolate or otherwise estimate an appropriate control voltage based on data in the database (1620). If such data exists, it is applied to the current control voltage by adding an offset to the control voltage to provide the control voltage value predicted in the database (1630). If no such data exists or after data is applied to the control voltage, the BTS requests a fast lock mode from the BSC and/or an element associated with the BSC (1640). The BSC and/or associated element responds by sending unicast timing packets to the BTS at a higher rate than normal. In one embodiment, the PLL alters the loop divider value N and possibly the phase error clipping threshold, the phase detector gain and loop filter parameters to enter the fast-lock mode of operation (1650), after which the PLL is run in fast lock mode (1660) until locked (1670) and the adjusted (former "current" control voltage plus/minus offset added at 1630) control voltage and temperature are added to the database (1680). In another embodiment, the fast lock mode is used to quickly measure the current frequency error by using the higher rate of timing packets. Determining the frequency error can include determining the average of the derivative of the clipped phase error, as discussed above or determining mean time interval error measurements. The quality of the frequency error estimation can be further qualified by examining additional statistics, such as variation and the value of the standard deviation of phase error over the frequency error estimation period. A relatively low phase error standard deviation, which is relatively constant over the frequency error estimation interval, indicates that the frequency error estimation is relatively accurate. Similarly, the average value and standard deviation of loopback delays can be monitored for relative consistency over the frequency error estimation interval. If the average loopback delays are relatively constant over the frequency error estimation interval and have a relatively low standard deviation, this indicates that the frequency error estimation is relatively accurate. A frequency error estimation, which is predicted to be relatively accurate can be used to directly control the VCO output frequency. Preferably, the VCO gain, or response in terms of Hz per control voltage can be approximated relatively accurately, such that when a given frequency error is estimated, a relatively accurate adjustment of the VCO control voltage can be applied.

The selection of a particular threshold of temperature variation, which is used to trigger the fast lock mode, may involve several considerations, such as the specifications of the VCO output frequency with respect to temperature variations. For example, if a VCO is used which is designed to vary no more than +/−0.1 ppm over a temperature change of +/−10 degrees Celsius and if the maximum allowable PLL frequency error is +/−0.1 ppm, then it may be possible to select a temperature variation threshold of +/−10 degrees Celsius or less. Additional considerations may include the maximum expected PLL frequency error in normal operation due to network jitter and varying delays. Still other considerations include the overall tolerance of an application to frequency errors and to the probability of frequency errors, which are larger than otherwise required. For example, if an application targets an indoor environment, in which large temperature variations are expected to be relatively infrequent and within an expected range of temperature variation, then such considerations can be included in the design of the PLL and possibly reduce overall cost. The fast lock mode can also be used to lock the PLL when the BTS is initialized due to a power on reset, for example.

Figure 17:
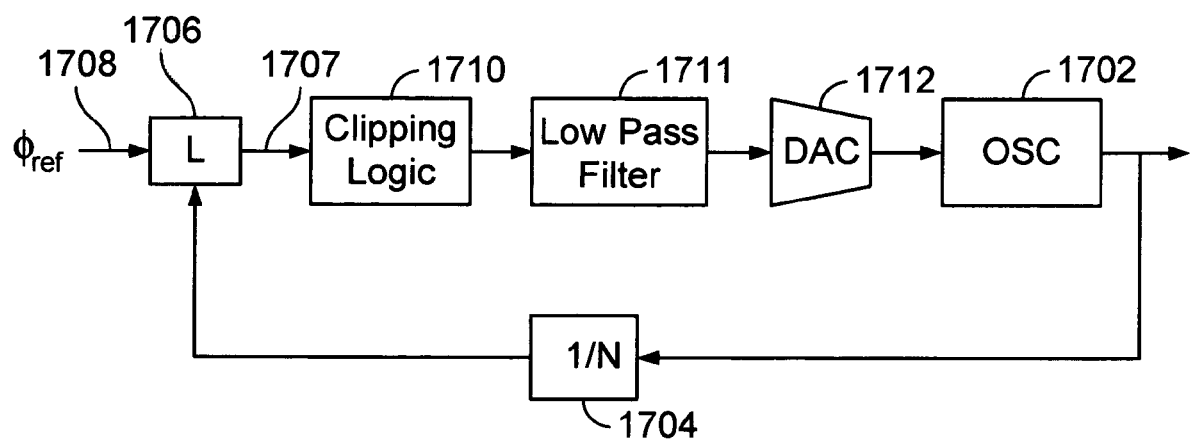
FIG. 17 is a block diagram illustrating an embodiment of a PLL with phase clipping.

FIG. 17 is a block diagram illustrating an embodiment of a PLL with phase clipping. The output of a local oscillator 1702 is provided to a divider/counter 1704. In some embodiments, the divider/counter 1704 divides the output of oscillator 1702 by 10e6 and uses the divided down feedback signal to increment a counter that starts at an initial value of 0, increments by one with each pulse of the divided down feedback signal, up to a maximum of value of 255, after which it rolls back over to 0 again. A latch 1706 serves as a phase detector by outputting on line 1707 the value of the counter in response to receiving a timing packet (or other reference signal) on line 1708. A clipping logic 1710 clips any error in excess of a prescribed maximum, e.g., as described above in connection with 310 of FIG. 3. The clipped (if necessary) error, or the original error if clipping is not required, is provided to a digital low pass filter 1711, which uses the digital error value provided by the clipping logic (e.g., a clipped or unclipped counter and/or counter offset from zero value from divider/ counter 1704) to generate a control signal provided to digital-to-analog converter 1712, which converts the digital control signal to an analog control signal provided to oscillator 1702.

A PLL with phase clipping, resynchronization, or both have been disclosed. By clipping the magnitude of phase error beyond a prescribed limit, the effect of excessive jitter in a network or other communication path by which a timing packet or other reference signal is provided can be minimized without having to narrow the bandwidth of the loop filter to a point at which the PLL does not respond sufficiently to variations in oscillator output. Resynchronization enables the PLL to respond in step fashion to step changes in a transmission path by which the reference signal is received. In some embodiments, phase clipping and resynchronization are combined to achieve a PLL that tracks the reference well while ignoring excessive jitter in the reference signal transmission path and responding well to long term changes in transmission delay of the reference signal.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of controlling an oscillator, comprising:
    comparing a reference signal to a feedback signal derived at least in part from an output signal of the oscillator to determine a phase error;
    clipping a magnitude of at least one of the phase error and a change in the phase error, if required, to provide at least one of a clipped phase error that has a clipped magnitude that does not exceed a prescribed maximum phase error and a clipped change in phase error that has a clipped magnitude that does not exceed a prescribed maximum change in phase error;
    determining that a temperature associated with the oscillator has changed by at least a threshold amount over a minimum time interval; and
        adjusting a control voltage input to the oscillator based on a stored data associated with a current value of the temperature if a stored data associated with the current value of the temperature is available, and
        entering a fast lock mode if no stored data associated with the current value of the temperature is available.

2. A method as recited in claim 1, wherein the reference signal comprises a timing packet.

3. A method as recited in claim 2, wherein the timing packet provides reference signal phase information in the form of an arrival time of the timing packet.

4. A method as recited in claim 2, wherein the timing packet provides reference signal phase information in the form of a time data included in a payload of the timing packet.

5. A method as recited in claim 1, wherein the reference signal is received via a communication path characterized by jitter.

6. A method as recited in claim 1, wherein the reference signal comprises a timing packet received via a packet data network.

7. A method as recited in claim 1, wherein clipping the magnitude of the phase error comprises determining that the magnitude exceeds the prescribed maximum and providing as output a clipped phase error that is equal to the prescribed maximum phase error.

8. A method as recited in claim 1, further comprising providing the resulting clipped phase error to a loop filter.

9. A method as recited in claim 1, wherein the oscillator comprises one or more of the following: a voltage controlled oscillator, a digital frequency synthesizer, or another analog or digital source of a periodic signal.

10. A method as recited in claim 1, further comprising resynchronizing the oscillator with the reference signal based at least in part on a determination that a resynchronization triggering event has occurred.

11. A method as recited in claim 10, wherein the resynchronization triggering event comprises one or more of the following: arrival of scheduled or periodic resynchronization time; ending of a pseudorandom interval; detection that the phase error has been limited continuously and constantly over a prescribed interval; and receipt of an indication that a transmission delay associated with a communication path by which the reference signal is received has changed.

12. A method as recited in claim 10, wherein resynchronizing includes sorting a plurality of stored phase detector error outputs in ascending order, finding a median value, and subtracting the median value from the phase error before it is clipped.

13. A method as recited in claim 10, wherein resynchronizing includes resetting a loop divider counter.

14. A phased lock loop circuit, comprising:
    an oscillator;
    a phase detector configured to compare a reference signal to a feedback signal derived at least in part from an output signal of the oscillator to determine a phase error; and
    phase clipping logic configured to:
        clip a magnitude of the phase error, if required, to provide a clipped phase error that has a clipped magnitude that does not exceed a prescribed maximum phase error;
        determine that a temperature associated with the oscillator has changed by at least a threshold amount over a minimum time interval; and
        adjust a control voltage input to the oscillator based on a stored data associated with a current value of the temperature if a stored data associated with the current value of the temperature is available, and
        entering a fast lock mode if no stored data associated with the current value of the temperature is available.

15. A phase locked loop circuit as recited in claim 14, further comprising a resynchronization logic configured to resynchronize the oscillator with the reference signal based at least in part on a determination that a resynchronization triggering event has occurred.

16. A phased lock loop circuit as recited in claim 14, wherein the reference signal comprises a timing packet.

17. A phased lock loop circuit as recited in claim 16, wherein the timing packet provides reference signal phase information in the form of an arrival time of the timing packet.

18. A phased lock loop circuit as recited in claim 16, wherein the timing packet provides reference signal phase information in the form of a time data included in a payload of the timing packet.

19. A phased lock loop circuit as recited in claim 14, wherein the reference signal is received via a communication path characterized by jitter.

20. A phased lock loop circuit as recited in claim 14, wherein the reference signal comprises a timing packet received via a packet data network.

21. A phased lock loop circuit as recited in claim 14, wherein the phase clipping logic is configured to clip the magnitude of the phase error at least in part by determining that the magnitude exceeds the prescribed maximum and providing as output a clipped phase error that is equal to the prescribed maximum phase error.

22. A phased lock loop circuit as recited in claim 14, wherein the phase clipping logic is configured to provide the resulting clipped phase error to a loop filter.

23. A phased lock loop circuit as recited in claim 14, wherein the oscillator comprises one or more of the following: a voltage controlled oscillator, a digital frequency synthesizer, or another analog or digital source of a periodic signal.

24. A computer program product for controlling an oscillator, the computer program product being embodied in a computer readable medium and comprising computer instructions for:

comparing a reference signal to a feedback signal derived at least in part from an output signal of the oscillator to determine a phase error;

clipping a magnitude of at least one of the phase error and a change in the phase error, if required, to provide at least one of a clipped phase error that has a clipped magnitude that does not exceed a prescribed maximum phase error and a clipped change in phase error that has a clipped magnitude that does not exceed a prescribed maximum change in phase error;

determining that a temperature associated with the oscillator has changed by at least a threshold amount over a minimum time interval; and adjusting a control voltage input to the oscillator based on a stored data associated with a current value of the temperature if a stored data associated with the current value of the temperature is available, and entering a fast lock mode if no stored data associated with the current value of the temperature is available.

25. A method of controlling an oscillator, comprising:

comparing a reference signal to a feedback signal derived at least in part from an output signal of the oscillator to determine a phase error;

clipping a magnitude of at least one of the phase error and a change in the phase error, if required, to provide at least one of a clipped phase error that has a clipped magnitude that does not exceed a prescribed maximum phase error and a clipped change in phase error that has a clipped magnitude that does not exceed a prescribed maximum change in phase error; and resynchronizing the oscillator with the reference signal based at least in part on a determination that a resynchronization triggering event has occurred;

wherein resynchronizing includes sorting a plurality of stored phase detector error outputs in ascending order, finding a median value, and subtracting the median value from the phase error output before it is clipped.

* * * * *